United States Patent
Chen

(10) Patent No.: US 7,301,813 B2
(45) Date of Patent: Nov. 27, 2007

(54) COMPENSATING FOR COUPLING DURING READ OPERATIONS OF NON-VOLATILE MEMORY

(75) Inventor: Jian Chen, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/616,741

(22) Filed: Dec. 27, 2006

(65) Prior Publication Data

US 2007/0109849 A1   May 17, 2007

Related U.S. Application Data

(62) Division of application No. 11/099,133, filed on Apr. 5, 2005, now Pat. No. 7,196,928.

(51) Int. Cl.
*G11C 11/34* (2006.01)
(52) U.S. Cl. .............................. 365/185.18; 365/189.07
(58) Field of Classification Search ........... 365/185.18, 365/189.07
See application file for complete search history.

(56) References Cited

U.S. PATENT DOCUMENTS

| | | | |
|---|---|---|---|
| 5,532,962 | A | 7/1996 | Auclair |
| 5,539,690 | A | 7/1996 | Talreja |
| 5,673,221 | A * | 9/1997 | Calligaro et al. ........... 365/168 |
| 5,764,572 | A | 6/1998 | Hammick |
| 5,831,900 | A | 11/1998 | Miyamoto |
| 5,867,429 | A | 2/1999 | Chen |
| 6,046,935 | A | 4/2000 | Takeuchi |
| 6,046,940 | A | 4/2000 | Takeuchi |
| 6,222,762 | B1 | 4/2001 | Guterman |
| 6,259,632 | B1 | 7/2001 | Khouri |
| 6,304,485 | B1 | 10/2001 | Harari |
| 6,377,507 | B1 | 4/2002 | Tsao |
| 6,396,742 | B1 | 5/2002 | Korsh |
| 6,477,101 | B2 | 11/2002 | Cavaleri |
| 6,522,580 | B2 | 2/2003 | Chen |
| 6,535,423 | B2 | 3/2003 | Trivedi |
| 6,542,407 | B1 | 4/2003 | Chen |

(Continued)

FOREIGN PATENT DOCUMENTS

EP 01271553 1/2003

(Continued)

OTHER PUBLICATIONS

Notice of Allowance dated Jul. 2, 2007, U.S. Appl. No. 11/616,745, filed Dec. 27, 2006.

(Continued)

*Primary Examiner*—Tuan T. Nguyen
(74) *Attorney, Agent, or Firm*—Vierra Magen Marcus & DeNiro LLP

(57) ABSTRACT

Shifts in the apparent charge stored on a floating gate (or other charge storing element) of a non-volatile memory cell can occur because of the coupling of an electric field based on the charge stored in adjacent floating gates (or other adjacent charge storing elements). The problem occurs most pronouncedly between sets of adjacent memory cells that have been programmed at different times. To compensate for this coupling, the read process for a given memory cell will take into account the programmed state of an adjacent memory cell.

4 Claims, 30 Drawing Sheets

U.S. PATENT DOCUMENTS

| | | |
|---|---|---|
| 6,570,790 B1 | 5/2003 | Harari |
| 6,580,638 B2 | 6/2003 | Conley |
| 6,594,181 B1 | 7/2003 | Yamada |
| 6,643,188 B2 | 11/2003 | Tanaka |
| 6,657,891 B1 | 12/2003 | Shibata |
| 6,717,847 B2 | 4/2004 | Chen |
| 6,771,536 B2 | 8/2004 | Li |
| 6,781,877 B2 | 8/2004 | Cernea |
| 6,785,169 B1 | 8/2004 | Nemati |
| 6,798,698 B2 | 9/2004 | Tanaka |
| 6,807,095 B2 | 10/2004 | Chen |
| 6,870,766 B2 | 3/2005 | Cho et al. |
| 6,870,768 B2 | 3/2005 | Cernea |
| 6,873,552 B2 | 3/2005 | Ishii |
| 6,888,758 B1 | 5/2005 | Hemink |
| 6,947,326 B2 | 9/2005 | Torii |
| 6,947,327 B2 | 9/2005 | Kato |
| 6,950,342 B2 | 9/2005 | Lindhorst |
| 6,956,770 B2 | 10/2005 | Khalid |
| 6,956,779 B2 | 10/2005 | Tran |
| 7,012,835 B2 | 3/2006 | Gonzalez |
| 7,020,017 B2 | 3/2006 | Chen |
| 7,031,214 B2 | 4/2006 | Tran |
| 7,057,936 B2 | 6/2006 | Yaegashi |
| 7,088,618 B2 * | 8/2006 | Hoshino et al. ....... 365/185.05 |
| 7,099,194 B2 | 8/2006 | Tu |
| 7,173,858 B2 | 2/2007 | Kato |
| 7,177,196 B2 | 2/2007 | Takeuchi |
| 7,187,585 B2 | 3/2007 | Li |
| 7,193,898 B2 | 3/2007 | Cernea |
| 7,196,928 B2 | 3/2007 | Chen |
| 7,196,946 B2 | 3/2007 | Chen |
| 7,206,235 B1 | 4/2007 | Lutze |
| 2003/0137888 A1 | 7/2003 | Chen |
| 2003/0161182 A1 | 8/2003 | Li |
| 2004/0047182 A1 | 3/2004 | Cernea |
| 2004/0057283 A1 | 3/2004 | Cernea |
| 2004/0057285 A1 | 3/2004 | Cernea |
| 2004/0057287 A1 | 3/2004 | Cernea |
| 2004/0057318 A1 | 3/2004 | Cernea |
| 2004/0060031 A1 | 3/2004 | Cernea |
| 2004/0109357 A1 | 6/2004 | Cernea |
| 2004/0213031 A1 | 10/2004 | Hosono |
| 2005/0073978 A1 | 4/2005 | Kim |
| 2005/0162913 A1 | 7/2005 | Chen |
| 2006/0221714 A1 | 10/2006 | Li |
| 2007/0058432 A1 | 3/2007 | Hosono |

FOREIGN PATENT DOCUMENTS

| | | |
|---|---|---|
| EP | 01329898 | 1/2003 |

OTHER PUBLICATIONS

Notice of Allowance dated Jul. 2, 2007, U.S. Appl. No. 11/616,769, filed Dec. 27, 2006.

Notice of Allowance dated Jun. 15, 2007, U.S. Appl. No. 11/616,762, filed Dec. 27, 2006.

Notice of Allowance dated Apr. 20, 2007, U.S. Appl. No. 11/616,757, filed Dec. 27, 2006.

Notice of Allowance and Fees Due; dated Aug. 23, 2007, U.S. Appl. No. 11/616,736, filed Dec. 27, 2006.

Notice of Allowance and Fees Due; dated Aug. 24, 2007, U.S. Appl. No. 11/675,632, filed Feb. 16, 2007.

U.S. Appl. No. 11/616,736, filed Dec. 27, 2006.
U.S. Appl. No. 11/616,745, filed Dec. 26, 2006.
U.S. Appl. No. 11/675,632, filed Jun. 16, 2007.
U.S. Appl. No. 11/616,757, filed Dec. 27, 2006.
U.S. Appl. No. 11/616,762, filed Dec. 27, 2006.
U.S. Appl. No. 11/616,764, filed Dec. 27, 2006.
U.S. Appl. No. 11/616,769, filed Dec. 27, 2006.
U.S. Appl. No. 11/616,778, filed Dec. 27, 2006.

* cited by examiner

Fig. 9

| LEFT NEIGHBOR | | | Programming Storage Unit | RIGHT NEIGHBOR | | |
|---|---|---|---|---|---|---|
| MODE | $INV_L$ | $V_{BL-1}$ | Bit line Offset $\Delta V_{BL-0}$ | MODE | $INV_R$ | $V_{BL-1'}$ |
| Program Inhibit | LOW | $V_{DD}$ | $\Delta V_{11}$ (e.g., 0.3V) | Program Inhibit | LOW | $V_{DD}$ |
| Program Inhibit | LOW | $V_{DD}$ | $\Delta V_{10}$ (e.g., 0.15V) | Program | HIGH | $\Delta V$ |
| Program | HIGH | $\Delta V$ | $\Delta V_{01}$ (e.g., 0.15V) | Program Inhibit | LOW | $V_{DD}$ |
| Program | HIGH | $\Delta V$ | $\Delta V_{00}$ (e.g., 0V) | Program | HIGH | $\Delta V$ |

Fig. 16
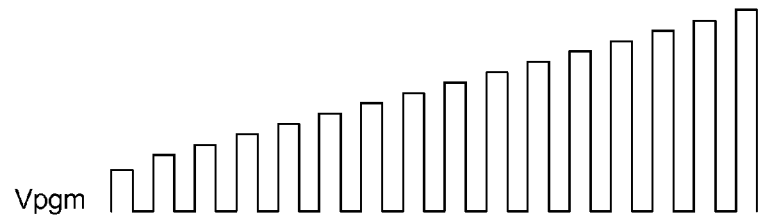
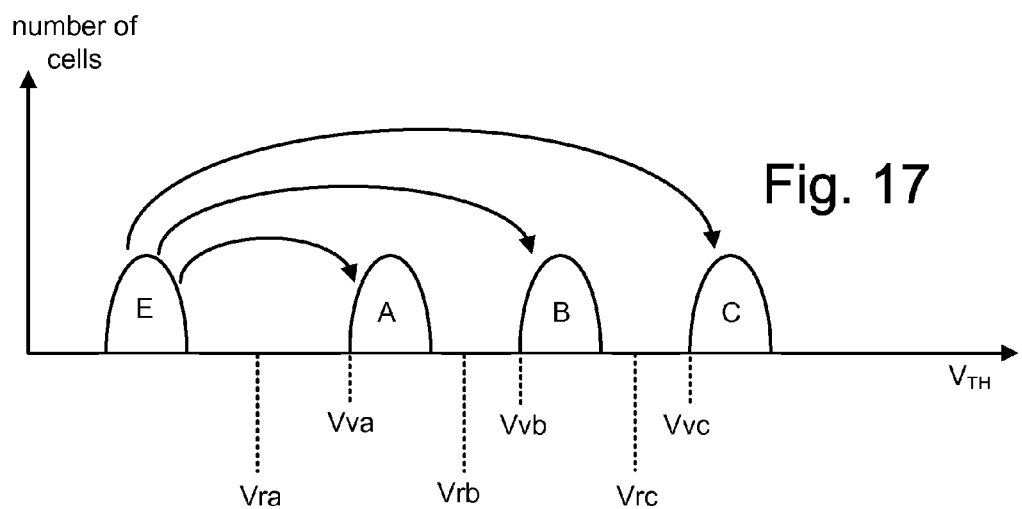
Fig. 17
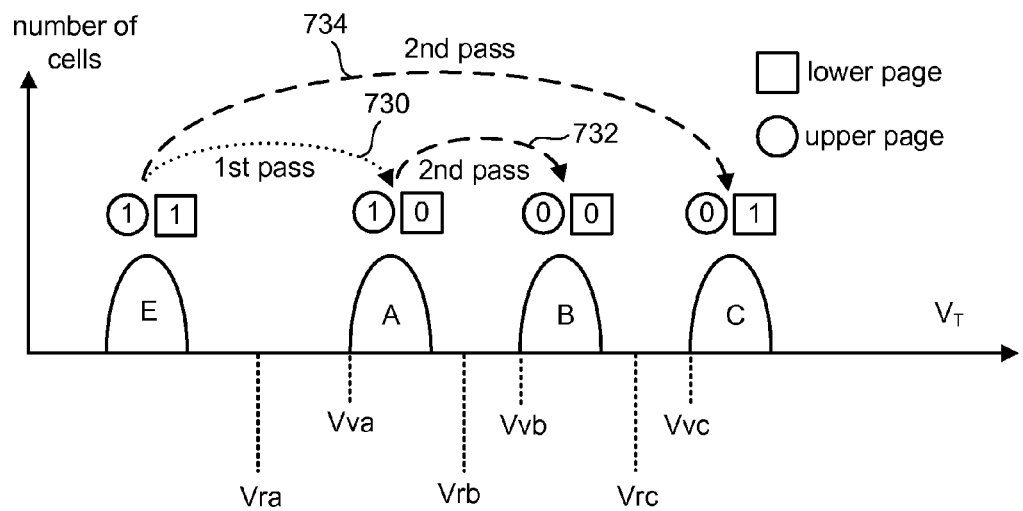
Fig. 18

| Wordline | all bit lines |
|---|---|
| WL3 | Page 3 |
| WL2 | Page 2 |
| WL1 | Page 1 |
| WL0 | Page 0 |

Fig. 20A

| Wordline | Even Bit Lines | Odd Bit Lines |
|---|---|---|
| WL3 | Page 6 | Page 7 |
| WL2 | Page 4 | Page 5 |
| WL1 | Page 2 | Page 3 |
| WL0 | Page 0 | Page 1 |

Fig. 20B

| Wordline | Upper/ Lower Page | All Bit Lines |
|---|---|---|
| WL3 | upper | Page 7 |
|  | lower | Page 6 |
| WL2 | upper | Page 5 |
|  | lower | Page 4 |
| WL1 | upper | Page 3 |
|  | lower | Page 2 |
| WL0 | upper | Page 1 |
|  | lower | Page 0 |

Fig. 20C

| Wordline | Upper/ Lower Page | Even Bit Lines | Odd Bit Lines |
|---|---|---|---|
| WL3 | upper | Page 14 | Page 15 |
|  | lower | Page 12 | Page 13 |
| WL2 | upper | Page 10 | Page 11 |
|  | lower | Page 8 | Page 9 |
| WL1 | upper | Page 6 | Page 7 |
|  | lower | Page 4 | Page 5 |
| WL0 | upper | Page 2 | Page 3 |
|  | lower | Page 0 | Page 1 |

Fig. 20D

| Wordline | Upper/ Lower Page | Even Bit Lines | Odd Bit Lines |
|---|---|---|---|
| WL3 | upper | Page 13 | Page 15 |
| | lower | Page 12 | Page 14 |
| WL2 | upper | Page 9 | Page 11 |
| | lower | Page 8 | Page 10 |
| WL1 | upper | Page 5 | Page 7 |
| | lower | Page 4 | Page 6 |
| WL0 | upper | Page 1 | Page 3 |
| | lower | Page 0 | Page 2 |

Fig. 20E

| Wordline | Upper/ Lower Page | All Bit Lines |
|---|---|---|
| WL3 | upper | Page 7 |
| | lower | Page 5 |
| WL2 | upper | Page 6 |
| | lower | Page 3 |
| WL1 | upper | Page 4 |
| | lower | Page 1 |
| WL0 | upper | Page 2 |
| | lower | Page 0 |

Fig. 20F

| Wordline | Upper/ Lower Page | Even Bit Lines | Odd Bit Lines |
|---|---|---|---|
| WL3 | upper | Page 14 | Page 15 |
| | lower | Page 10 | Page 11 |
| WL2 | upper | Page 12 | Page 13 |
| | lower | Page 6 | Page 7 |
| WL1 | upper | Page 8 | Page 9 |
| | lower | Page 2 | Page 3 |
| WL0 | upper | Page 4 | Page 5 |
| | lower | Page 0 | Page 1 |

Fig. 20G

|  | State E | State A | State B | State C |
|---|---|---|---|---|
| (1) Read at Vra | 1 | 0 | 0 | 0 |
| (2) Read at Vrb | 1 | 1 | 0 | 0 |
| (3) (Invert 2) XOR 1 | 1 | 0 | 1 | 1 |
| (4) Read at Vrc | 1 | 1 | 1 | 0 |
| (5) 4 AND 3 | 1 | 0 | 1 | 0 |

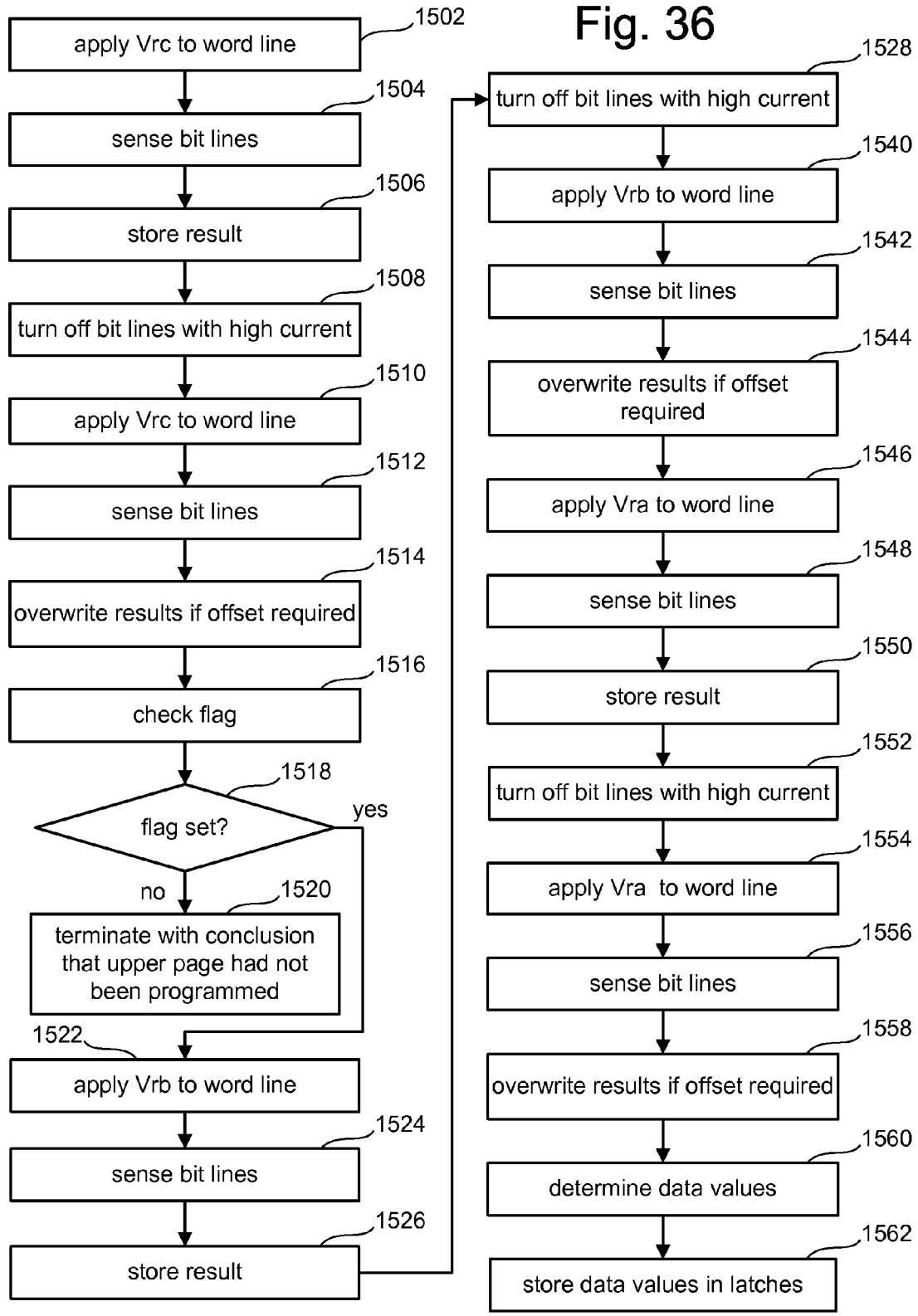

COMPENSATING FOR COUPLING DURING READ OPERATIONS OF NON-VOLATILE MEMORY

CLAIM OF PRIORITY

This application is a divisional application of U.S. patent application Ser. No. 11/099,133, "Compensating for Coupling During Read Operations on Non-Volatile Memory," published as U.S. Publication No. 2006-0221692A1, by Chen, et al., filed on Apr. 5, 2005, now U.S. Pat. No. 7,196,928, incorporated herein by reference.

CROSS-REFERENCE TO RELATED APPLICATIONS

This Application is related to United States patent application titled "Compensating For Coupling In Non-Volatile Storage," by Jian Chen, Raul-Adrian Cernea and Gerrit Jan Hemink, U.S. application Ser. No. 11/099,239, published as U.S. Publication No. 2006-0221683A1, filed Apr. 5, 2005, which is incorporated herein by reference in its entirety.

This Application is related to United States Patent Application titled "Read Operation For Non-Volatile Storage That Includes Compensation For Coupling," by Yan Li and Jian Chen, U.S. application Ser. No. 11/099,049, published as U.S. Publication No. 2006-0221714A1, filed on Apr. 5, 2005, which is incorporated herein by reference in its entirety.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. patent application Ser. No. 10/379,608, titled "Self-Boosting Technique," filed on Mar. 5, 2003; and in U.S. patent application Ser. No. 10/629,068, titled "Detecting Over Programmed Memory," filed on Jul. 29, 2003; both applications are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Shifts in the apparent charge stored on a floating gate can occur because of the coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are across from the target floating gate because they are on both a neighboring bit line and neighboring word line.

The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multistate memories than memories using only two states (binary memories). Furthermore, the reduction of the space between word lines and of the space between bit lines will also increase the coupling between adjacent floating gates.

Thus, there is a need to reduce the effect of coupling between floating gates.

SUMMARY OF THE INVENTION

To compensate for the coupling between floating gates, the read process for a given memory cell will take into account the programmed state of an adjacent memory cell. Various embodiments are disclosed.

In one embodiment, for each non-volatile storage element of at least a subset of non-volatile storage elements, an offset is determined from a predetermined set of offsets based on a charge level stored in an adjacent storage element. A set of read processes is performed, with each read process using a different one of the predetermined sets of offsets and performed on all of the non-volatile storage elements. There is at least one read process for each offset. Each non-volatile storage element provides final data from the appropriate one of the read processes associated with the offset determined for the respective non-volatile storage element.

Some embodiments include a method for reading data from a first set of multi-state non-volatile storage elements storing data for at least a first page and a second page. The method includes determining charge level data for a second set of multi-state non-volatile storage elements adjacent to the first set of multi-state non-volatile storage elements. Multiple read processes are performed relative to a first reference value for distinguishing threshold voltages relative to two adjacent data states. Each read process uses a different one of a predetermined set of offsets with the first reference value. Each of the first set of non-volatile storage elements provides final data from the appropriate one of the read processes corresponding to one offset that is associated with a respective adjacent non-volatile storage element. Data values are determined for the first page based on the final data, without using other data from user data read processes based on non-zero offsets to reference values between other pairs of adjacent data states.

Some embodiments include programming a first set of non-volatile storage elements and a second set of non-volatile storage elements, both of which store first and second groupings of data. The programming includes writing to a particular non-volatile storage element with respect to the second grouping of data subsequent to writing to adjacent non-volatile storage elements for the first grouping of data. When intending to read data from the first set of non-volatile storage elements, the system will also read from the second set of non-volatile storage elements. The reading from the second set of non-volatile storage elements does not require reading accurate data, rather the read operation need only obtain an indication of a charge level or apparent charge level. Read operations are performed on the first set of non-volatile storage elements. These read operations use a first compensation for non-volatile storage elements of the first set of non-volatile storage elements adjacent to non-volatile storage elements of the second set of non-volatile storage elements that provide a first indication. These read operations do not use the first compensation for non-volatile storage elements of the first set of non-volatile storage elements adjacent to non-volatile storage elements of the second set of non-volatile storage elements that do not provide the first indication.

BRIEF DESCRIPTION OF THE DRAWINGS

FIG. 9 is a table describing a portion of the operation of a sense module.

FIG. 16 is an example wave form applied to the control gates of non-volatile memory cells.

FIG. 17 depicts an example set of threshold voltage distributions.

FIG. 18 depicts an example set of threshold voltage distributions.

FIGS. 20A-G are tables depicting the order of programming non-volatile memory in various embodiments.

FIG. 36 is a flow chart describing one embodiment of a process for reading upper page data associated with the process of FIG. 35.

DETAILED DESCRIPTION

Figure 1:
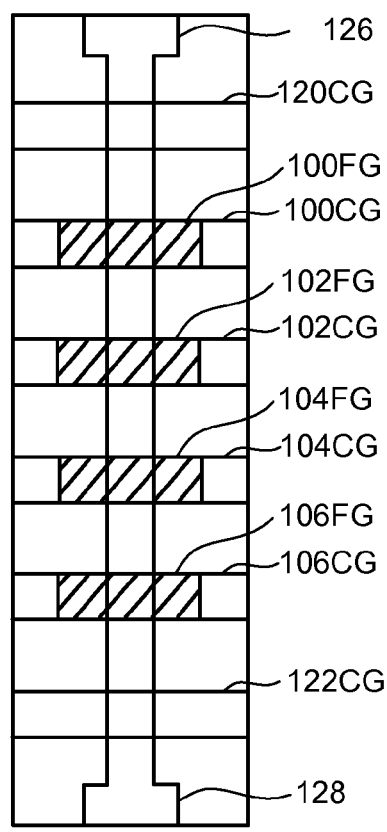
FIG. 1 is a top view of a NAND string.
Figure 2:
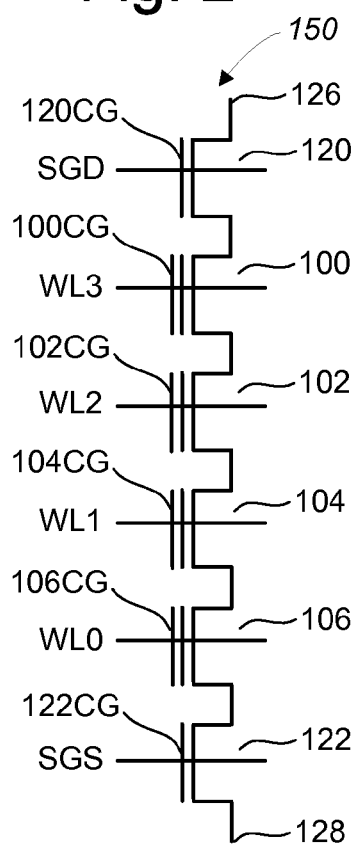
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
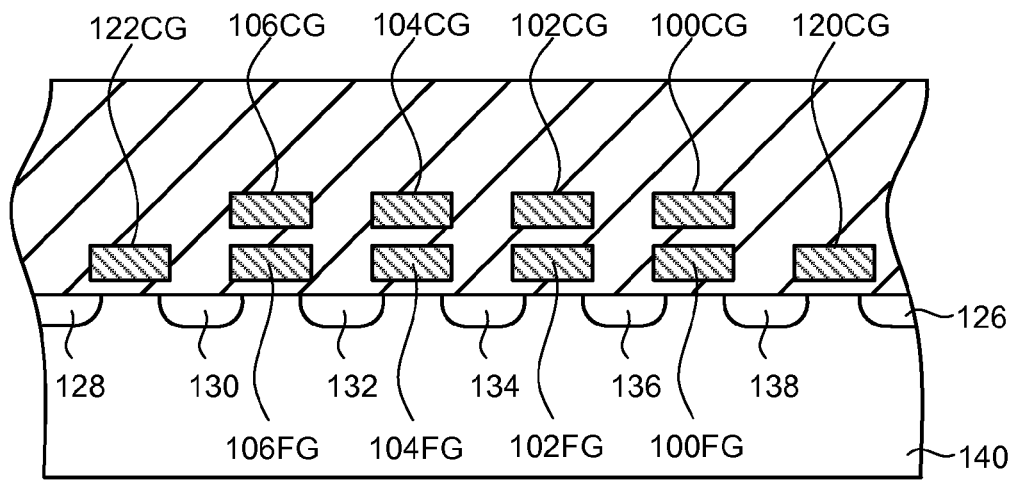
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells.

Relevant examples of NAND-type flash memories and their operation are provided in the following U.S. patents/patent applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. patent application Ser. No. 09/893,277 (Publication No. US2003/0002348). Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
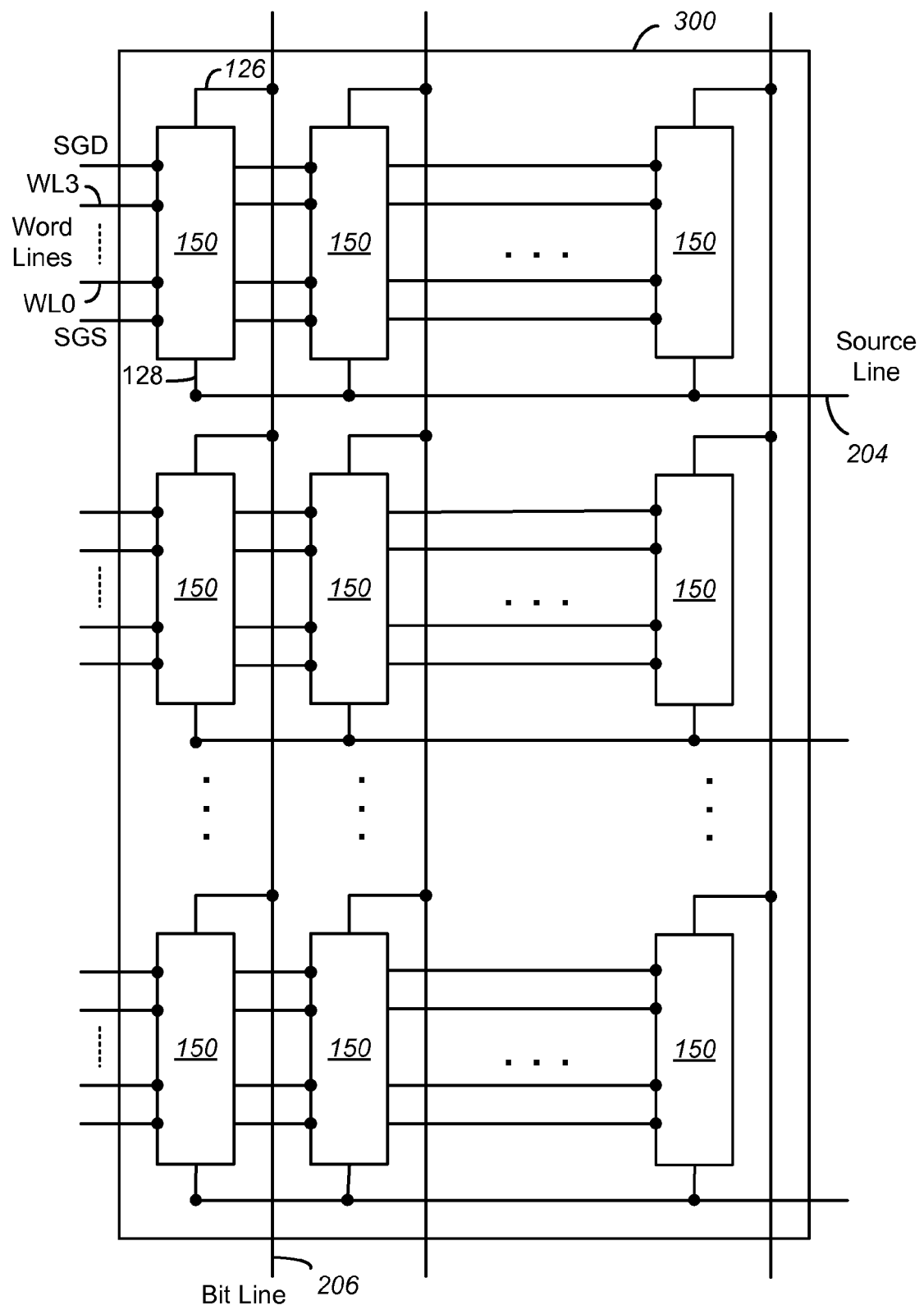
FIG. 4 is a block diagram of an array of NAND flash memory cells.

FIG. 4 illustrates an example of an array of NAND cells, such as those shown in FIGS. 1-3. Along each column, a bit line 206 is coupled to the drain terminal 126 of the drain select gate for the NAND string 150. Along each row of NAND strings, a source line 204 may connect all the source terminals 128 of the source select gates of the NAND strings. An example of a NAND architecture array and its operation as part of a memory system is found in U.S. Pat. Nos. 5,570,315; 5,774,397; and 6,046,935.

The array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
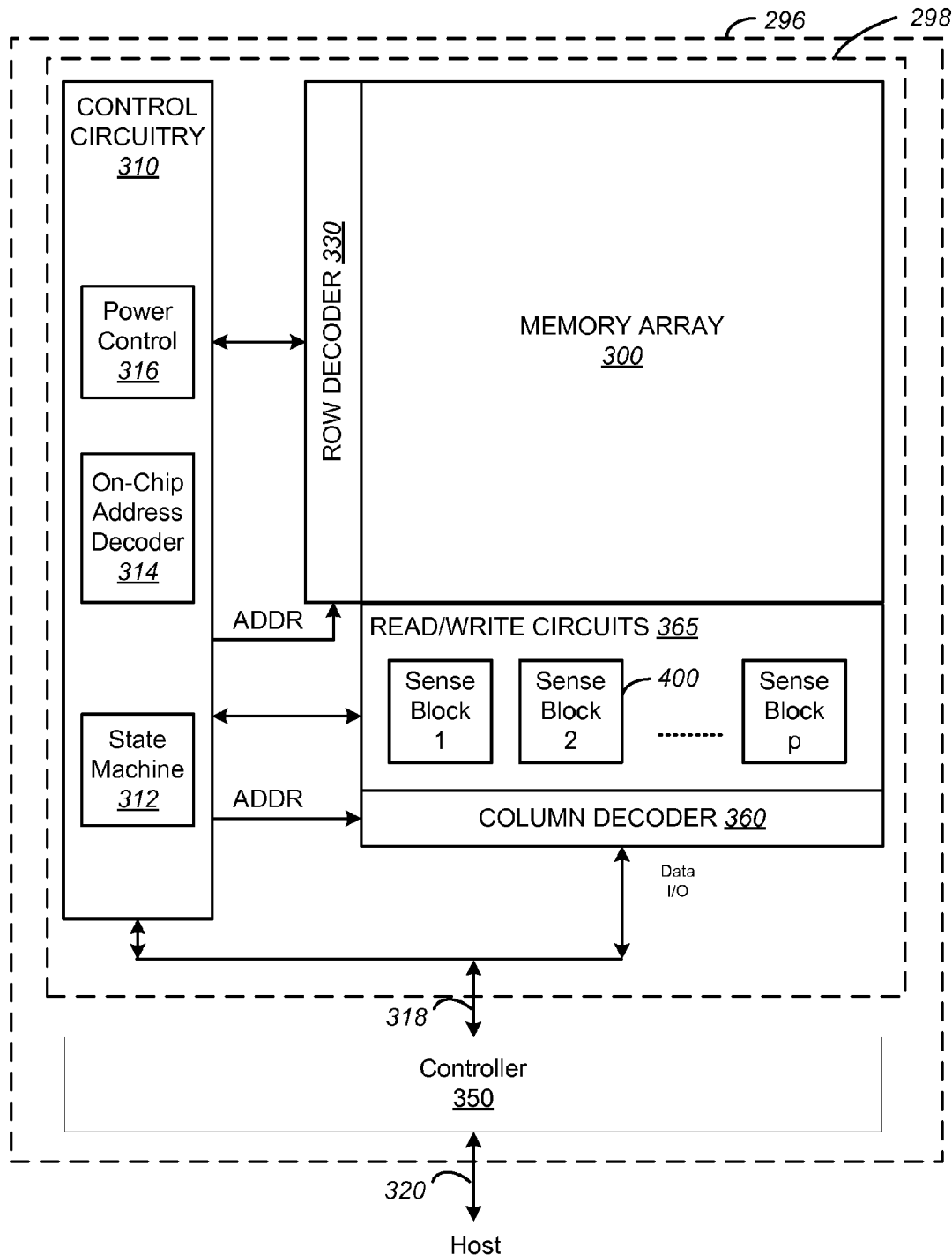
FIG. 5 is a block diagram of a non-volatile memory system.

FIG. 5 illustrates a memory device 296 having read/write circuits for reading and programming a page of memory cells in parallel, according to one embodiment of the present invention. Memory device 296 may include one or more memory die 298. Memory die 298 includes a two-dimensional array of memory cells 300, control circuitry 310, and read/write circuits 365. The memory array 300 is addressable by word lines via a row decoder 330 and by bit lines via a column decoder 360. The read/write circuits 365 include multiple sense blocks 400 and allow a page of memory cells to be read or programmed in parallel. Typically a controller 350 is included in the same memory device 296 (e.g., a removable storage card) as the one or more memory die 298. Commands and Data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

Figure 6:
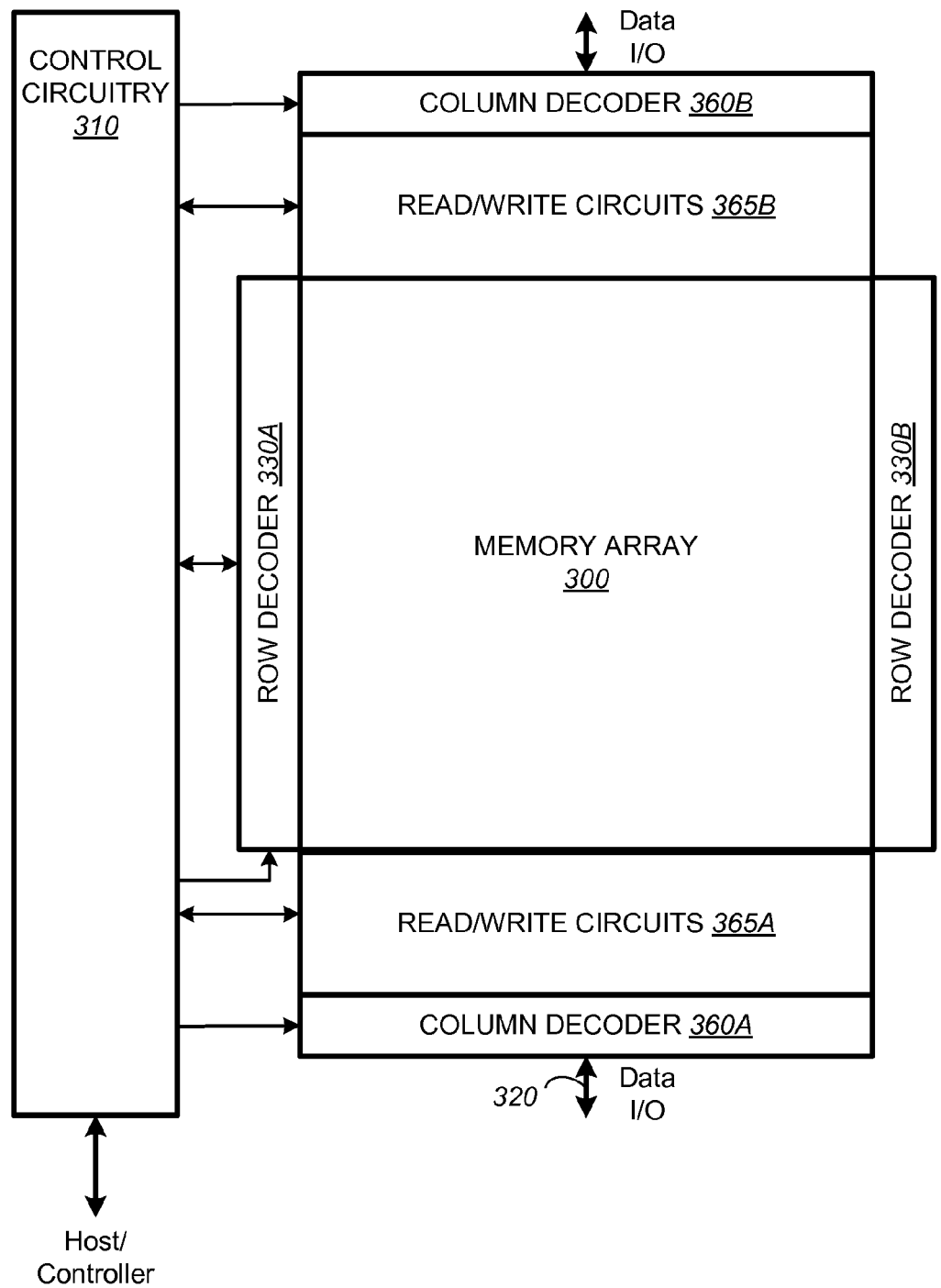
FIG. 6 is a block diagram of a non-volatile memory system.

FIG. 6 illustrates another arrangement of the memory device 296 shown in FIG. 5. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 6 can also include a controller, as described above for the device of FIG. 5.

Figure 7:
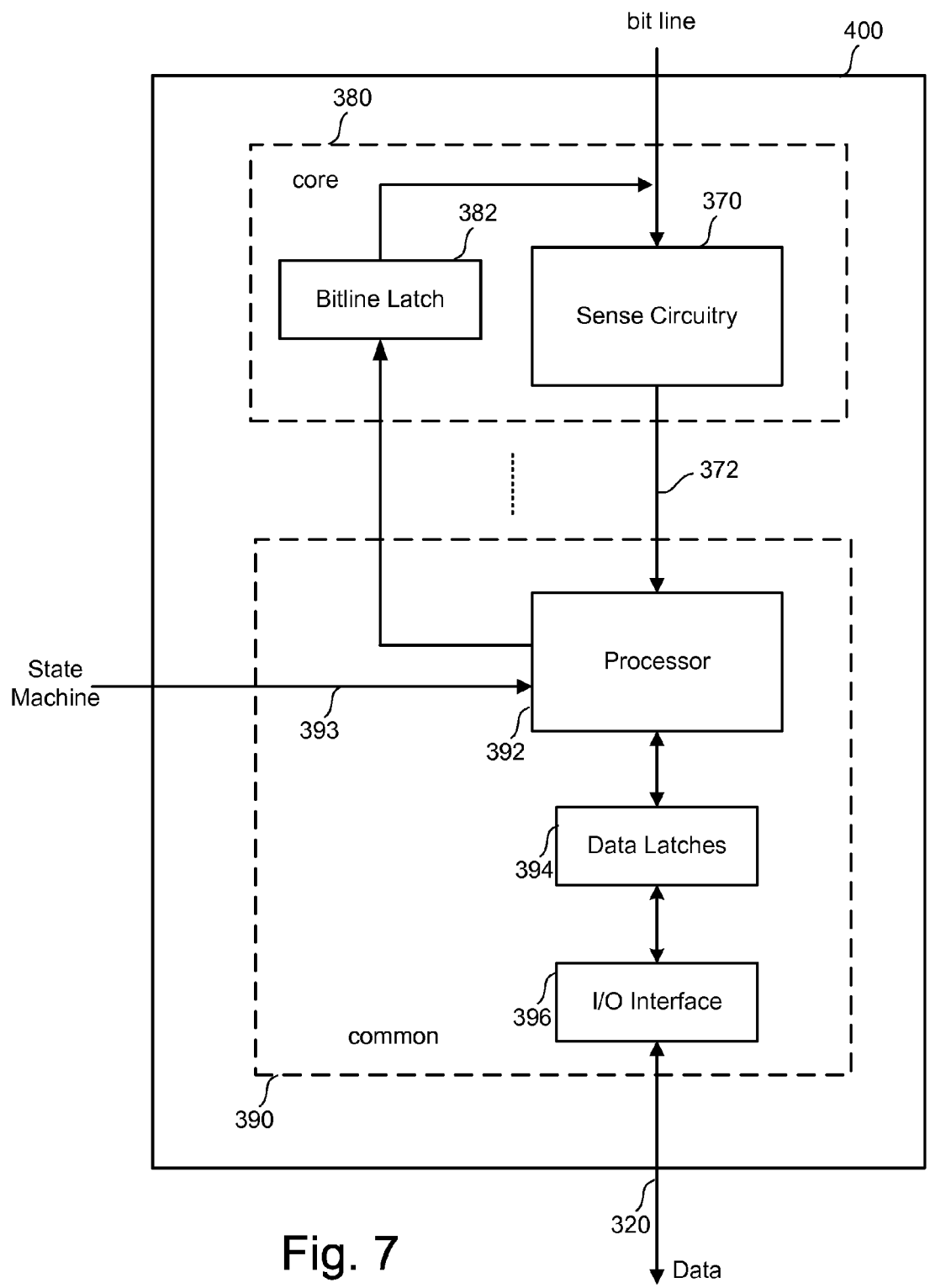
FIG. 7 is a block diagram depicting one embodiment of the sense block.

FIG. 7 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details refer to U.S. patent application Ser. No. 11/026,536 "Non-Volatile Memory & Method with Shared Processing for an Aggregate of Sense Amplifiers" filed on Dec. 29, 2004 which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 398 provides an interface between data latches 394 and the data bus 320.

During read or sensing, the operation of the system is under the control of state machine 312 that controls the supply of different control gate voltages to the addressed cell. As it steps through the various predefined control gate voltages corresponding to the various memory states supported by the memory, the sense module 380 will trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 392 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394 from the data bus 320. The program operation, under the control of the state machine, comprises a series of programming voltage pulses applied to the control gates of the addressed memory cells. Each programming pulse is followed by a read back (verify) to determine if the cell has been programmed to the desired memory state. Processor 392 monitors the read back memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 8:
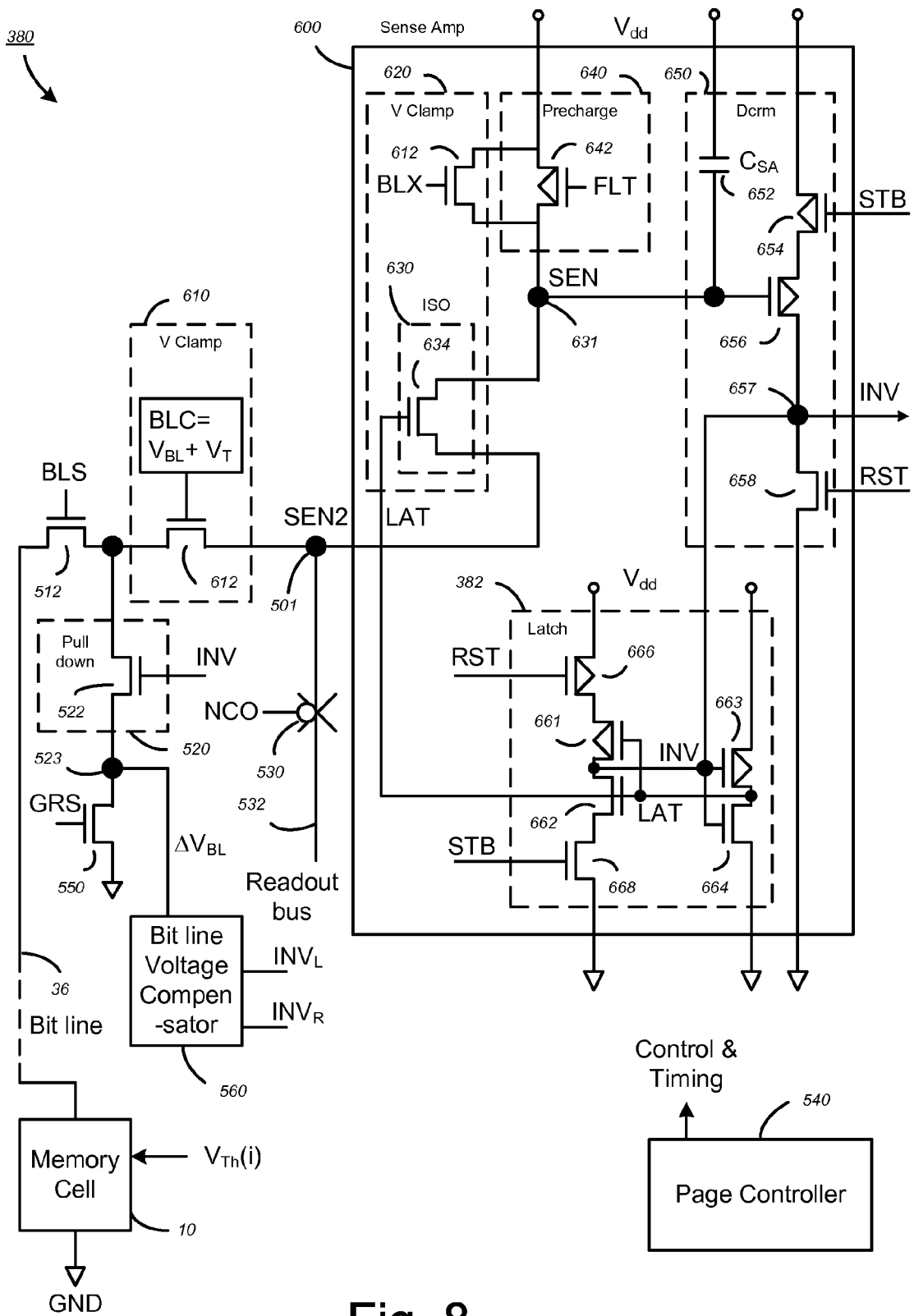
FIG. 8 is a schematic diagram of one embodiment of a sense module.

FIG. 8 illustrates an example of sense module 380; however, other implementations can also be used. Sense module 380 comprises a bit line isolation transistor 512, bit line pull down circuit 520, bit line voltage clamp 610, readout bus transfer gate 530 and a sense amplifier 600 which in this implementation contains bitline latch 382. Note that the memory cell 10 and page controller 540 in FIG. 8 are associated with but not structurally a part of sense module 380.

In general, a page of memory cells is operated on in parallel. Therefore a corresponding number of sense modules are in operation in parallel. In one embodiment, page controller 540 expediently provides control and timing signals to the sense modules operated in parallel.

Sense module 380 is connectable to the bit line 36 of a memory cell when the bit line isolation transistor 512 is enabled by a signal BLS. Sense module 380 senses the conduction current of the memory cell by means of sense amplifier 600 and latches the read result as a digital voltage level SEN2 at a sense node 501 and outputs it to a readout bus 532 via gate 530.

The sense amplifier 600 essentially comprises a second voltage clamp 620, a precharge circuit 640, a discriminator or compare circuit 650 and a latch 660. The discriminator circuit 650 includes a dedicated capacitor 652. In one embodiment, a reference voltage is applied to the control gate of a memory cell being read. If the reference voltage is greater than the threshold voltage of the memory cell, then the memory cell will turn on and conduct current between its source and drain. If the reference voltage is not greater than the threshold voltage of the memory cell, then the memory cell will not turn on and will not conduct current between its source and drain. In many implementations, the on/off may be a continuous transition so that the memory cell will conduct different currents in response to different control gate voltages. If the memory cell is on and conducting current, the conducted current will cause the voltage on node SEN 631 to decrease, effectively charging or increasing the voltage across capacitor 652 whose other terminal is at Vdd. If the voltage on node SEN discharges to a predetermined level during a predetermined sensing period, then sense amplifier 600 reports that the memory cell turned on in response to the control gate voltage.

One feature of the sense module 380 is the incorporation of a constant voltage supply to the bit line during sensing. This is preferably implemented by the bit line voltage clamp 610. The bit line voltage clamp 610 operates like a diode clamp with transistor 612 in series with the bit line 36. Its gate is biased to a constant voltage BLC equal to the desired bit line voltage VBL above its threshold voltage VT. In this way, it isolates the bit line from the sense node 501 and sets a constant voltage level for the bit line, such as the desired VBL=0.5 to 0.7 volts during program-verifying or reading. In general, the bit line voltage level is set to a level such that it is sufficiently low to avoid a long precharge time, yet sufficiently high to avoid ground noise and other factors.

The sense amplifier 600 senses the conduction current through the sense node 501 and determines whether the conduction current is above or below a predetermined value. The sense amplifier outputs the sensed result in a digital form as the signal SEN2 at the sense node 501 to the readout bus 532.

The digital control signal INV, which is essentially an inverted state of the signal SEN2 after read, is also output to control the pull down circuit 520. When the sensed conduction current is higher than the predetermined value, INV will be HIGH and SEN2 will be LOW. This result is reinforced by the pull down circuit 520. Pull down circuit 520 includes an n-transistor 522 controlled by the control signal INV and another n-transistor 550 controlled by the control signal GRS. The GRS signal when LOW allows the bit line 36 to be floated regardless of the state of the INV signal. During programming, the GRS signal goes HIGH to allow the bit line 36 to be pulled to ground and controlled by INV. When the bit line is required to be floated, the GRS signal goes LOW.

FIGS. 10(H)-10(O) illustrate the timing of the preferred sense module shown in FIG. 8. An additional description of the operation of the sense module in regards to other features has been described in co-pending U.S. patent application Ser. No. 10/254,830, "Non-Volatile Memory And Method With Reduced Source Line Bias Errors," filed on Sep. 24, 2002, by Raul-Adrian Cernea and Yan Li, published on Mar. 25, 2004 as Pub. App. No. 2004/0057287; and U.S. patent application Ser. No. 10/665,828, "Non-Volatile Memory And Method with Improved Sensing," filed on Sep. 17, 2003, by Raul-Adrian Cernea and Yan Li, published on Jun. 10, 2004 as Pub. App. No. 2004/0109357. The entire disclosure of these two referenced applications is hereby incorporated herein by reference in their entirety.

In one embodiment, a bit line bias is supplied by a bit line voltage compensator 560. It senses the INV signal from its left and right neighbors in the form of the signals INVL and INVR, respectively, and responsively supplies a bias voltage ΔVBL according to the bias voltage table of FIG. 9. The bias voltage is supplied to node 523 that is switchably coupled to the bit line 36. During programming, both the signals BLS and INV are HIGH while the signal GRS is LOW. These enable the bit line 36 access to the bit line voltage compensator 560.

FIG. 9 is a bias voltage table listing the offset voltage applied to the bit line as a function of the program-inhibit modes of its left and right neighbors. The center column lists the offset or bias voltage applied to the bit line of the storage unit under programming as a function of the modes of its left and right neighbors. Generally, the more of its neighbors that are in program-inhibit mode, the more bit line bias is required to offset the perturbation effect of the coupling from floating gates of adjacent bit lines.

FIGS. 10(A)-10(G) are timing diagrams illustrating the voltage compensation scheme during program operations, according to a first embodiment of the invention.

The voltages shown are applied to various word lines and bit lines of the memory array, for NAND strings under programming and program inhibition. The program operation can be grouped into a Bit Lines Precharge Phase, a Program Phase and a Discharge Phase.

Figure 10:
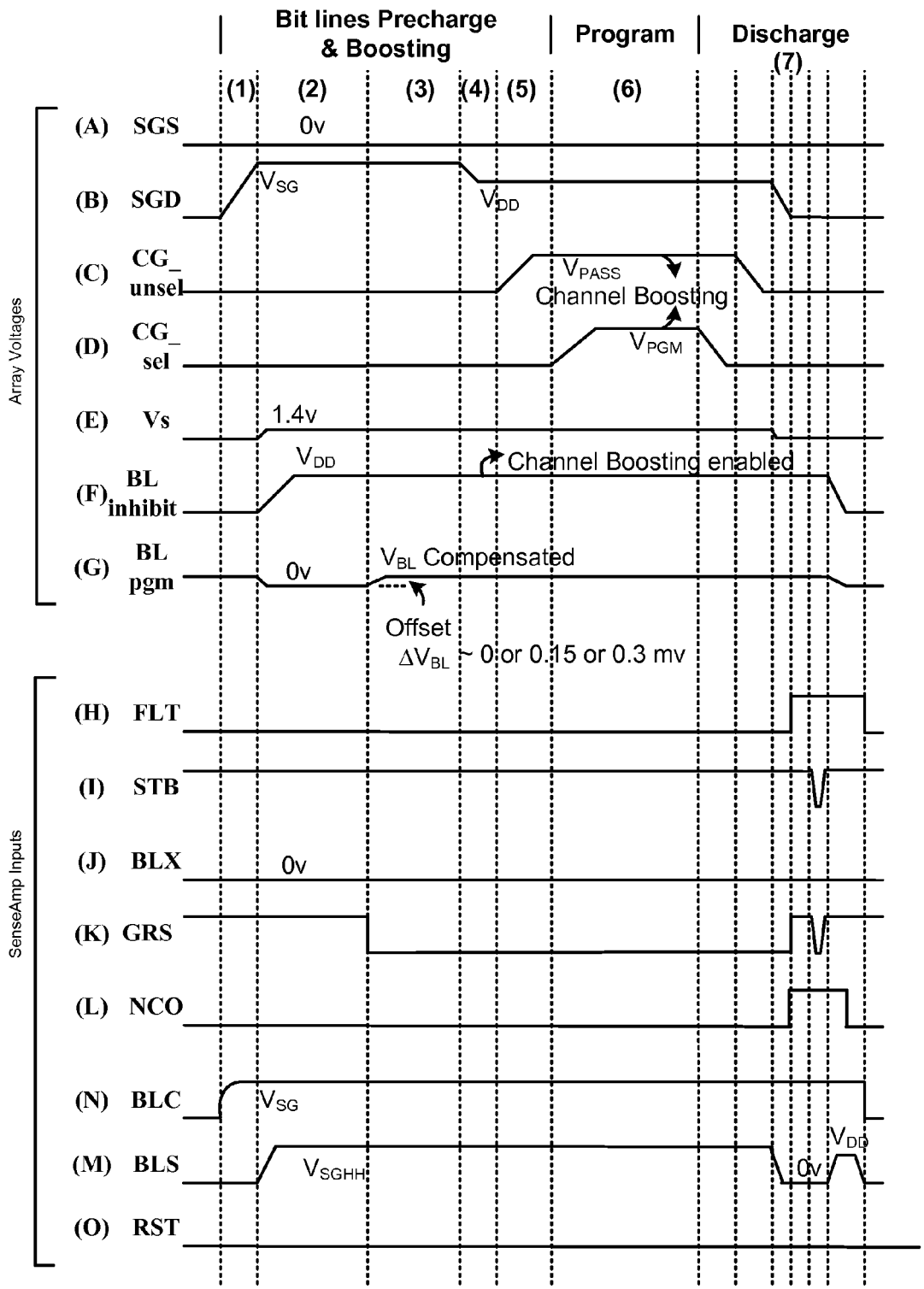
FIG. 10 is a timing diagram describing operation of a sense module.

In the Bit Lines Precharge Phase:

(1) The source select transistor is turned off by SGS at 0V (FIG. 10(A)) while the drain select transistor is turned on by SGD going high to VSG (FIG. 10(B)), thereby allowing a bit line to access a NAND string.

(2) The bit line voltage of a program-inhibited NAND string is allowed to rise to a predetermined voltage given by VDD (FIG. 10(F)). When the bit line voltage of the program-inhibited NAND string rises to VDD, the program-inhibited NAND string will float when the gate voltage SGD on the drain select transistor drops to VDD. At the same time, the bit line voltage of a programming NAND string is actively pulled down to 0V (FIG. 10(G)).

(3) The bit line voltage of the programming NAND string is biased with ΔVBL supplied by the bit line voltage compensator 560 (FIG. 10(G)). The value of ΔVBL output from the voltage compensator 560 depends on whether one or both of its neighbors is in program-inhibit mode or not.

(4) The drain word line connecting to the drain select transistors of a row of NAND strings has its voltage lowered to VDD. This will float only those program-inhibited NAND strings where their bit line voltage is comparable to VDD, since their drain select transistors are turned off (FIGS. 10(B) & 10(F)). As for the NAND strings containing a memory transistor to be programmed, their drain select transistors will not be turned off relative to the bit line voltage of near 0V at their drain.

(5) The memory transistors in a NAND string not being addressed have their control gate voltage set to VPASS to fully turn them on (FIG. 10(C)). Since a program-inhibited NAND string is floating, the high VPASS and Vpgm (program voltage) applied to the control gates of the unaddressed memory transistors boost up the voltages of their channels and charge storage elements, thereby inhibiting programming. VPASS is typically set to some intermediate voltage (e.g., ~10V) relative to Vpgm (e.g., ~15-24V).

In the Program Phase:

(6) Programming voltage Vpgm is applied to the control gate of a memory transistor selected for programming (FIG. 10(D)). The storage units under program inhibition (i.e., with boosted channels and charge storage units) will not be programmed. The storage units under programming will be programmed with a biased bit line voltage (FIG. 10(G)) to offset any perturbation due to one or both of its neighbors being in program-inhibit mode. One perturbation on a programming storage unit is due to an adjacent storage unit in the word line direction having a floated channel and charge storage unit capacitively boosted by a high control gate voltage from a word line. This occurs when a NAND string is put into program-inhibit mode. This also has the undesirable effect of perturbing (increasing) the voltage on a charge storage unit of the memory transistor to be programmed. By sensing what its neighbors are doing during programming of a storage unit, the perturbations of its neighbors are compensated accordingly with an appropriate bit line voltage bias.

In the Discharge Phase:

(7) The various control lines and bit lines are allowed to discharge.

One potential issue relevant to sensing memory cells is source line bias. When a large number of memory cells are sensed in parallel, their combined currents can result in significant voltage rise in a ground loop with finite resistance. This results in a source line bias which causes error in a read operation employing threshold voltage sensing.

Figure 11:
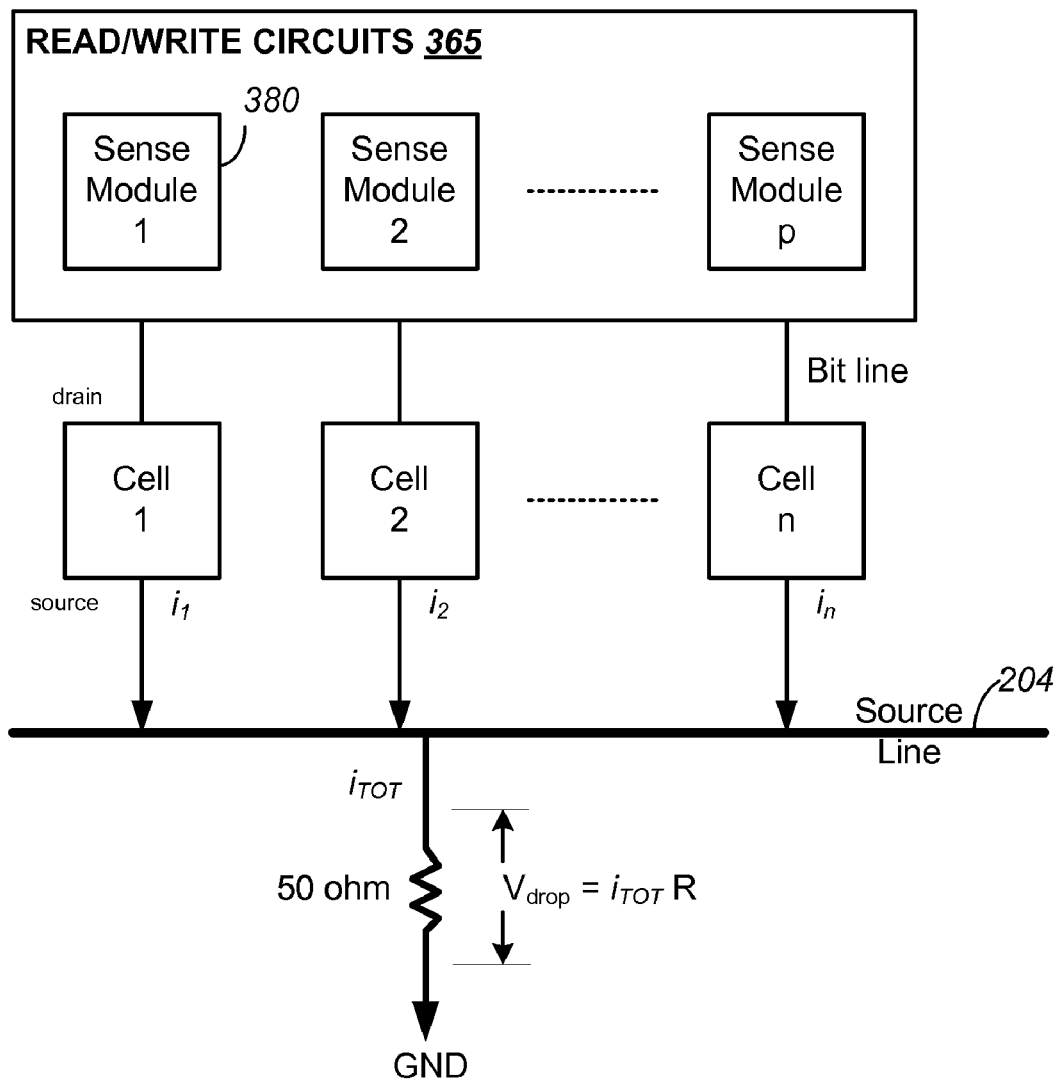
FIG. 11 is a block diagram explaining a voltage on a common source line.

FIG. 11 illustrates the problem of source voltage error due to current flow in the source line having a finite resistance to ground. The read/write circuits 365 operate on a page of memory cells simultaneously. Each sense module 380 in the read/write circuits 365 is coupled to a corresponding cell via a bit line. For example, a sense module 380 senses the conduction current $i_1$ (source-drain current) of a memory cell (e.g., cell 1). The conduction current flows from the sense module through the bit line into the drain of the memory cell and out from the source before going through a source line 204 to ground. In an integrated circuit chip, the sources of the cells in a memory array are all tied together as multiple branches of the source line 204 connected to some external ground pad (e.g., Vss pad) of the memory chip. Even when metal strapping is used to reduce the resistance of the source line, a finite resistance, R, remains between the source electrode of a memory cell and the ground pad. Typically, the ground loop resistance R is around 50 ohm.

For the entire page of memory being sensed in parallel, the total current flowing through the source line 204 is the sum of all the conduction currents, i.e., $iTOT=i1+i2+\ldots,+in$. Generally, each memory cell has a conduction current dependent on the amount of charge programmed into its charge storage element. For a given control gate voltage of the memory cell, a small charge will yield a comparatively higher conduction current. When a finite resistance exists between the source electrode of a memory cell and the ground pad, the voltage drop across the resistance is given by $Vdrop=iTOT\ R$.

For example, if 4,256 bit lines discharge at the same time, each with a current of 1 µA, then the source line voltage drop will be equal to 4,000 lines×1 µA/line×50 ohms ~0.2 volts. This source line bias will contribute to a sensing error of 0.2 volts when threshold voltages of the memory cells are sensed.

Figure 12:
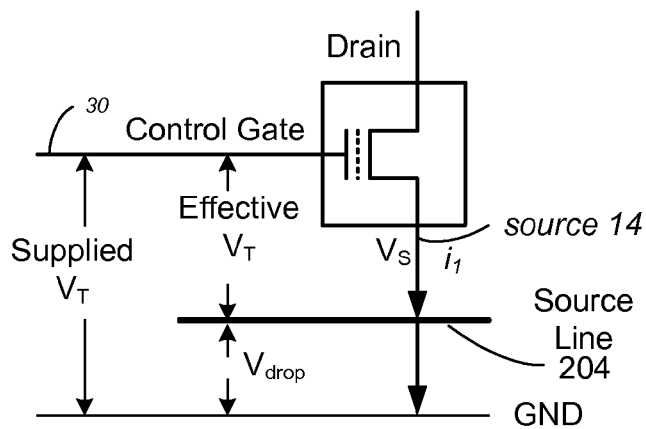
FIG. 12 depicts a memory cell connected to a source line.

FIG. 12 illustrates the error in the threshold voltage level of a memory cell caused by a source line voltage drop. The threshold voltage VT supplied to the control gate of the memory cell is relative to GND. However, the effective VT seen by the memory cell is the voltage difference between its control gate and source. There is a difference of approximately Vdrop between the supplied and effective VT (ignoring the smaller contribution of voltage drop from the source 14 to the source line). This Vdrop, or source line bias, will contribute to a sensing error of, for example, 0.2 volts when threshold voltages of the memory cells are sensed.

According to one aspect of the invention, a method for reducing source line bias is accomplished by read/write circuits with features and techniques for multi-pass sensing. Each pass helps to identify and shut down the memory cells with conduction current higher than a given demarcation current value. Typically, with each pass, the given demarcation current value progressively converges to the breakpoint current value for a conventional single-pass sensing. In this way, sensing in subsequent passes will be less affected by source line bias since the higher current cells have been shut down.

Figure 13:
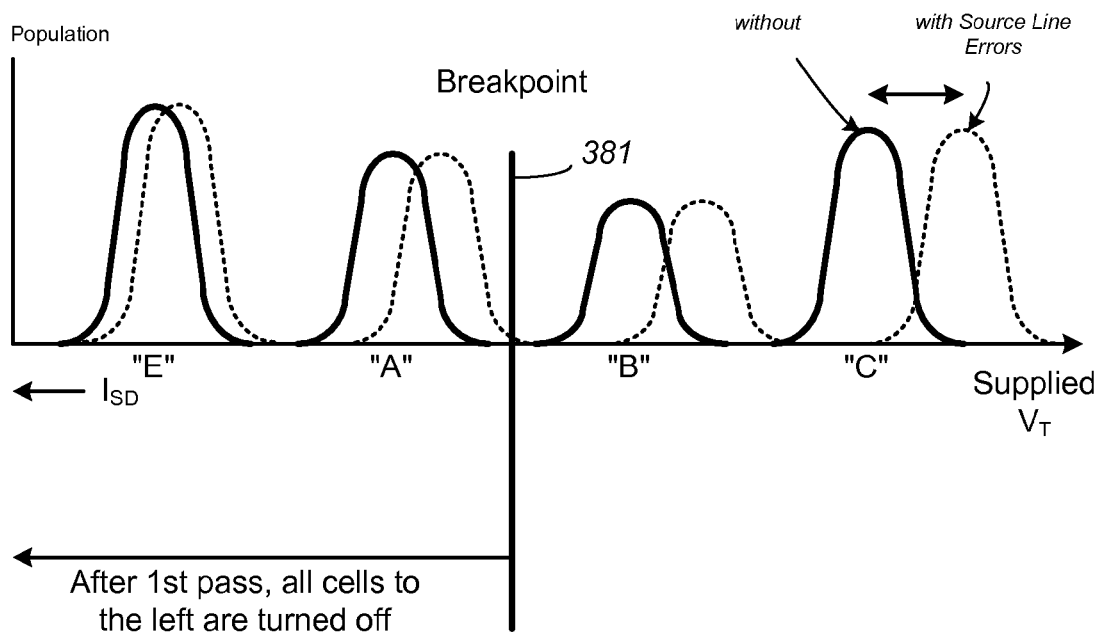
FIG. 13 shows various threshold voltage distributions.

FIG. 13 illustrates an example population distribution of a page of memory cells for a 4-state memory. Each cluster of memory cells is programmed within a range of conduction currents ISD clearly separated from each other. For example, a breakpoint 381 is a demarcating current value between two clusters, respectively representing the "A" and "B" memory states. In a conventional single-pass sensing, a necessary condition for a "B" memory state will be that it has a conduction current less than the breakpoint 381. If there were no source line bias, the population distribution with respect to the supplied threshold voltage VT would be depicted by the curve with the solid line. However, because of the source line bias error, the threshold voltage of each of the memory cells at its control gate is increased by the source line bias. This means a higher control gate voltage need be applied to compensate for the bias. In FIG. 13, the source line bias results in a shifting of the distribution (broken line) towards a higher apparent VT. The shifting will be more when sensing the higher threshold (lower current) memory states since more total array current is flowing due to the higher applied word line voltage. If the breakpoint 381 is designed for the case without source line error, then the existence of a source line error will have some of the tail end of "A" states having conduction currents appear in a region of no conduction, which means it would be higher than the breakpoint 381. This will result in some of the "A" states (more conducting) being mistakenly demarcated as "B" states (less conducting).

For example, the present multi-pass sensing can be implemented in two passes (j=1 to 2). After the first pass, those memory cells with conduction currents higher than the breakpoint 381 are identified and removed by turning off their conduction current. A preferred way to turn off their conduction currents is to set their drain voltages on their bit lines to ground. In a second pass (j=2), because of the removal of the high current states that contributed to the source line bias, the distribution with the broken line approaches that of the one with the solid line. Thus, sensing using the breakpoint 381 as the demarcation current value will not result in mistaking the "A" states for the "B" states.

As compared to a conventional one-pass approach, the present two-pass method substantially reduces the likelihood of misidentifying some of the "A" cells as "B" or higher cells. More than two passes are also contemplated, although there will be diminishing returns with increasing number of passes. Further, each pass may have the same demarcation current, or with each successive pass, the demarcation current used converges to that of a breakpoint normally used in a conventional single-pass sensing. Additionally, breakpoints can be used between states E and A, as well as between states B and C.

In general, there will be a page of memory cells being operated on by a corresponding number of multi-pass sense blocks 400. A page controller 540 supplies control and timing signals to each of the sense modules. In one embodiment, the page controller 540 is implemented as part of the state machine 312 in the control circuitry 310. In another embodiment, page controller 540 is part of the read/write circuits 365. Page controller 540 cycles each of the multi-pass sense blocks 400 through a predetermined number of passes (j=1 to N) and also supplies a predetermined demarcation current value $I_0(j)$ for each pass. The demarcation current value can also be implemented as a time period for sensing. After the last pass, the page controller 540 enables transfer gate 488 with a signal NCO to read the state of the SEN node 631 as sensed data to a readout bus 532. In all, a page of sense data will be read out from all of the sense modules.

Additional operation and timing of the sense module 380 during read/verify operations will be discussed with respect to the timing diagrams FIGS. 14(A)-14(K), which are demarcated into PHASES (1)-(9).

Phase (0): Setup

The sense module 380 (see FIG. 8) is connected to the bit line 36 via an enabling signal BLS (FIG. 14(A)). The Voltage clamp is enabled with BLC (FIG. 14(B)). The Precharge circuit 640 is enabled as a limited-current source with a control signal FLT (FIG. 14(C)).

Phase (1): Controlled Precharge

Sense amplifier 600 is initialized by a reset signal RST (FIG. 14(D)) which will pull the signal INV to ground via the transistor 658. Thus, on reset, INV is set to LOW. At the same time, a p-transistor 663 pulls a complementary signal LAT to $V_{dd}$ or HIGH (FIG. 14(H)).

Isolation gate 630 is formed by an n-transistor 632, which is controlled by the signal LAT. Thus, after reset, the isolation gate is enabled to connect sense node 501 to the sense amplifier's internal sense node 631, and the signal SEN2 will be the same as the signal SEN at the internal sense node 631.

The precharge circuit 640 precharges the bit line 36 through the internal sense node 631 and the sense node SEN2 501 for a predetermined period of time. This will bring the bit line to an optimal voltage for sensing the conduction therein.

The precharge circuit 640 includes a pull-up p-transistor 642 controlled by the control signal FLT ("FLOAT"). The bit line will be pulled up towards the desired bit line voltage as set by the bit line voltage clamp 610. The rate of pull-up will depend on the conduction current in the bit line. The smaller the conduction current, the faster the pull-up.

It has been described earlier that sensing errors due to the source line bias are minimized if those memory cells with conduction currents higher than a predetermined value are turned off and their contributions to the source line bias eliminated. Precharge circuit 640 is implemented to serve two functions. One is to precharge the bit line to an optimal sensing voltage. The other is to help identify those memory cells with conduction currents higher than a predetermined value for D.C. (Direct Current) sensing so that they may be eliminated from contributing to source line bias.

The D.C. sensing is accomplished by providing a precharge circuit that behaves like a current source for supplying a predetermined current to the bit line. The signal FLT that controls the p-transistor 642 is such that it "programs" a predetermined current to flow through the precharge circuit 640. As an example, the FLT signal may be generated from a current mirror with a reference current set to 500 nA. When the p-transistor 642 forms the mirrored leg of the current mirror, it will also have the same 500 nA throwing in it.

Figure 14:
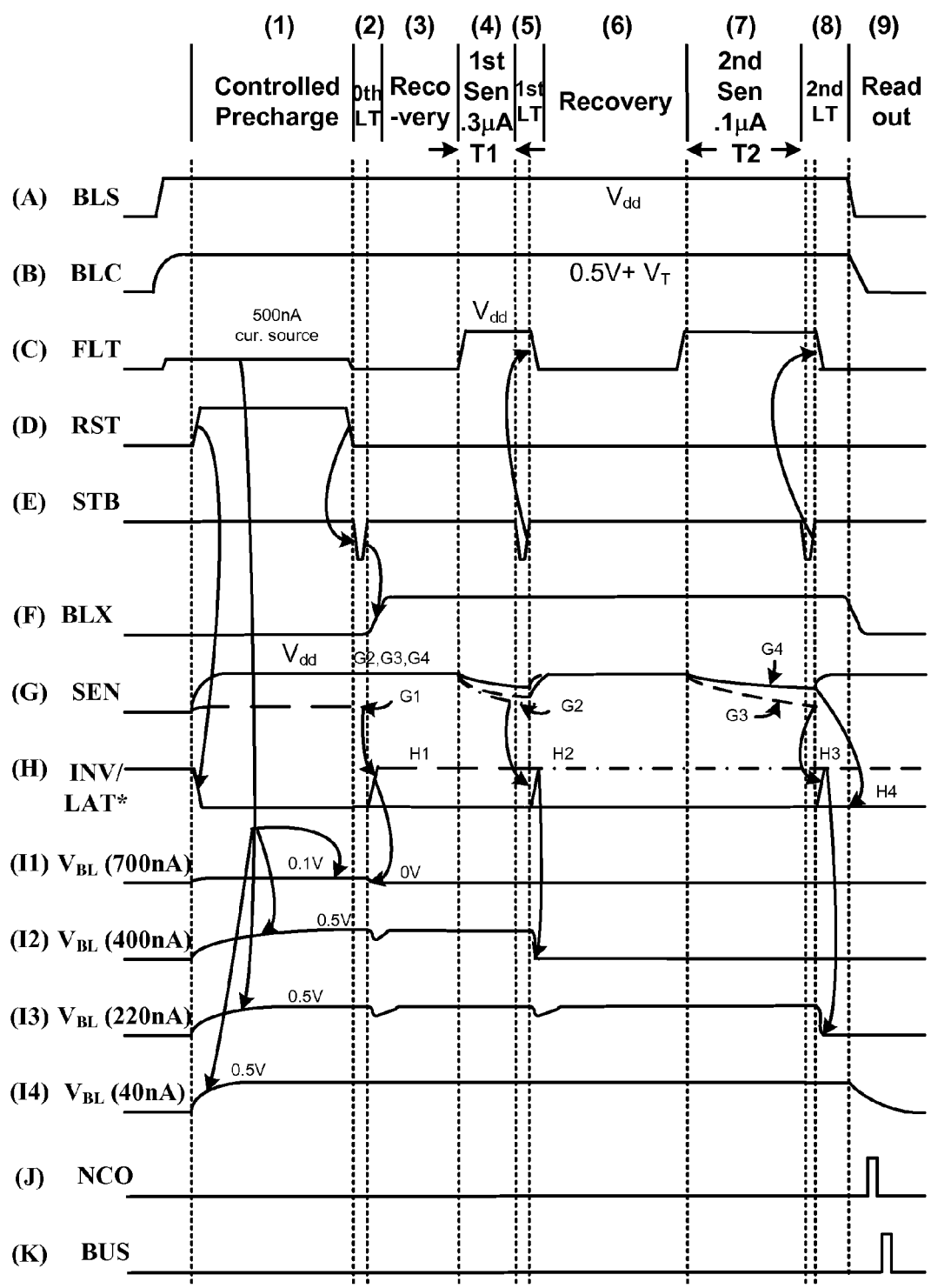
FIG. 14 is a timing diagram explaining a portion of the operation of a sense module.

FIGS. 14(I1)-14(I4) illustrate the voltages on four example bit lines connected respectively to memory cells with conduction currents of 700 nA, 400 nA, 220 nA and 40 nA. When the precharge circuit 640 is a current source with a limit of 500 nA, for example, a memory cell having a conduction current exceeding 500 nA will have the charges on the bit line drained faster than it can accumulate. Consequently, for the bit line with conduction current 700 nA, its voltage or the signal SEN at the internal sense node 631 will remain close to 0V (such as 0.1 volt; see FIG. 14(I1)). On the other hand, if the memory cell's conduction current is below 500 nA, the precharge circuit 640 will begin to charge up the bit line and its voltage will begin to rise towards the clamped bit line voltage (e.g., 0.5V set by the voltage clamp 610) (FIGS. 14(I2)-14(I4)). Correspondingly, the internal sense node 631 will either remain close to 0V or be pulled up to Vdd (FIG. 14(G)). Generally, the smaller the conduction current, the faster the bit line voltage will charge up to the clamped bit line voltage. Thus, by examining the voltage on a bit line after the controlled precharge phase, it is possible to identify if the connected memory cell has a conduction current higher or lower than a predetermined level.

Phase (2): D.C. Latching & Removing the High Current Cells from Subsequent Strobes After the controlled precharge phase, an initial D.C. high-current sensing phase begins where the signal SEN is sensed by the discriminator circuit 650. The sensing identifies those memory cells with conduction currents higher than the predetermined level. The discriminator circuit 650 includes two p-transistors 654 and 656 in series, which serve as a pull up for a node 657 registering the signal INV. The p-transistor 654 is enabled by a read strobe signal STB going LOW and the p-transistor 656 is enabled by the SEN signal at the internal sense node 631 going LOW. High current memory cells will have the signal SEN close to 0V or at least unable for its bit lines to be precharged sufficiently high to turn off the p-transistor 656. For example, if the weak pull up is limited to a current of 500 nA, it will fail to pull up a cell with conduction current of 700 nA (FIG. 14(G1)). When STB strobes LOW to latch, INV at the node 657 is pulled up to Vdd. This will set the latch circuit 660 with INV HIGH and LAT LOW (FIG. 14(H1)).

When INV is HIGH and LAT LOW, the isolation gate 630 is disabled and the sense node 481 is blocked from the internal sense node 631. At the same time, the bit line is pulled to ground by the pull down circuit 520 (FIGS. 8 & 14(I1)). This will effectively turn off any conduction current in the bit line, eliminating it from contributing to source line bias.

Thus, in one preferred implementation of the sense module 380, a limited-current source precharge circuit is employed. This provides an additional or alternative way (D.C. sensing) to identify bit lines carrying high currents and to turn them off to minimize source line bias error in subsequent sensing.

In another embodiment, the precharge circuit is not specifically configured to help identify high current bit lines but is optimized to pull up and precharge the bit line as fast as possible within the allowance of the maximum current available to the memory system.

Phase (3): Recovery/Precharge

Prior to a sensing of the conduction current in a bit line that has not been previously pulled down, the precharge circuit is activated by the signal FLT going LOW to precharge the internal sense node 631 to $V_{dd}$ (FIG. 14(C) and FIGS. 14(I2)-14(I4)) and the bit line which may have been partially coupled down due to a decrease in the voltage on adjacent bit lines.

Phase (4): First A.C. Sensing

In one embodiment, an A.C. (Alternating Current or transient) sensing is performed by determining the voltage drop at the floated internal sense node 631. This is accomplished by the discriminator or compare circuit 650 employing the capacitor $C_{SA}$ 652 coupled to the internal sense node 631, and considering the rate the conduction current is charging it (reducing the voltage on node SEN). In an integrated circuit environment, the capacitor 652 is typically implemented with a transistor; however, other implementations are suitable. Capacitor 652 has a predetermined capacitance, e.g., 30 fF, which can be selected for optimal current determination. The demarcation current value, typically in the range of 100-1000 nA, can be set by appropriate adjustment of the charging period.

The discriminator circuit 650 senses the signal SEN in the internal sense node 631. Prior to each sensing, the signal SEN at the internal sense node 631 is pulled up to $V_{dd}$ by the precharge circuit 640. This will initially set the voltage across the capacitor 652 to be zero.

When the sense amplifier 600 is ready to sense, the precharge circuit 640 is disabled by FLT going HIGH (FIG. 14(C)). The first sensing period T1 is ended by the assertion of the strobe signal STB. During the sensing period, a conduction current induced by a conducting memory cell will charge the capacitor. The voltage at SEN will decrease from $V_{dd}$ as the capacitor 652 is charged through the draining action of the conduction current in the bit line. FIG. 14(G) (see curves G2-G4) illustrates the SEN signal corresponding to the remaining three example bit lines connected respectively to memory cells with conduction currents of 400 nA, 220 nA and 40 nA, the decrease being more rapid for those with a higher conduction current.

Phase (5): First A.C. Latching and Removal of Higher Current Cells from Subsequent Sensing At the end of the first predetermined sensing period, SEN will have decreased to some voltage depending on the conduction current in the bit line (see curves G2-G4 of FIG. 14G). As an example, the demarcation current in this first phase is set to be at 300 nA. The capacitor $C_{SA}$ 652, the sensing period T1 and the threshold voltage of the p-transistor 656 are such that the signal SEN corresponding to a conduction current higher than the demarcation current (e.g., 300 nA) will drop sufficiently low to turn on the transistor 656 in the discriminator circuit 650. When latching signal STB strobes LOW, the output signal INV will be pulled HIGH, and will be latched by the latch 660 (FIG. 14(E) and FIG. 14(H) (curve H2)). On the other hand, the signal SEN corresponding to a conduction current below the demarcation current will produce a signal SEN unable to turn on the transistor 656. In this case, the latch 660 will remain unchanged, in which case LAT remains HIGH (FIGS. 14(H3) and 14(H4)). Thus, it can be seen that the discriminator circuit 650 effectively determines the magnitude of the conduction current in the bit line relative to a reference current set by the sensing period.

Sense amplifier 600 also includes the second voltage clamp 620 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value VBL, e.g., 0.5V. This will require the gate voltage BLC of the transistor 612 to be set at VBL+VT (where VT is the threshold voltage of the transistor 612) and the drain connected to the sense node 501 to be greater than the source, i.e., the signal SEN2>VBL. In particular, given the configurations of the voltage clamps 610 and 620, SEN2 should be no higher than the smaller of LAT−VT or BLX−VT, and SEN should be no lower. During sensing, the isolation gate 630 is in a pass-through mode. However, during sensing the signal SEN at the internal sense node 631 has a voltage that decreases from Vdd. The second voltage clamp 620 prevents SEN from dropping below LAT−VT or BLX−VT, whichever is lower. This is accomplished by an n-transistor 612 controlled by a signal BLX, where BLX is $\geq$VBL+VT (FIG. 13(F)). Thus, through the actions of the voltage clamps 610 and 620, the bit line voltage VBL is kept constant, e.g., ~0.5V, during sensing.

Measuring current using a dedicated capacitor 652 instead of traditional use of the bit line capacitance is advantageous in several respects. First, it allows a constant voltage source on the bit line thereby avoiding bit-line to bit-line crosstalk. Secondly, the dedicated capacitor 652 allows a capacitance to be selected that is optimal for sensing. For example, it may have a capacitance of about 30 fF as compared to a bit line capacitance of about 2 pF. A smaller capacitance can increase the sensing speed since it charges faster. Finally, sensing relative to a dedicated capacitance as compared to the prior art method of using the capacitance of the bit line allows the sensing circuits to be independent of the memory architecture or size.

In another embodiment, the current determination is accomplished by comparison with a reference current, which may be provided by the conduction current of a reference memory cell. This could be implemented with the compare current as part of a current mirror.

The output of the current determination is latched by the latch circuit 660. The latch circuit is formed as a Set/Reset latch by the transistors 661, 662, 663 and 664 together with the transistors 666 and 668. The p-transistor 666 is controlled by the signal RST (RESET) and the n-transistor 668 is controlled by the signal STB. A variation of the above-described sense amplifier that is adapted for low voltage operation is found in U.S. patent application Ser. No. 11/015,199 titled "Improved Memory Sensing Circuit And Method For Low Voltage Operation," Inventor Raul-Adrian Cernea, filed on Dec. 16, 2004, incorporated herein by reference in its entirety.

In general, there will be a page of memory cells being operated on by a corresponding number of multi-pass sense modules 380 (FIG. 8). For those memory cells having conduction current higher than the first demarcation current level, their LAT signal will be latched LOW (INV latched HIGH). This in turn activates the bit line pull down circuit 520 to pull the corresponding bit lines to ground, thereby turning off their currents.

Phase (6): Recovery/Precharge

Prior to the next sensing of the conduction current in a bit line such as bit line 36 that has not been previously pulled down, the precharge circuit is activated by the signal FLT to precharge the internal sense node 631 to $V_{dd}$ (FIG. 14(C)(6) and FIGS. 14(I3)(6)-14(I4)(6)).

Phase (7): Second Sensing

When the sense amplifier 600 is ready to sense, the precharge circuit 642 is disabled by FLT going HIGH (FIG. 14(C)). The second sensing period T2 is set by the assertion of the strobe signal STB. During the sensing period, a conduction current, if any, will charge the capacitor. SEN will decrease from $V_{dd}$ as the capacitor 652 is charging through the draining action of the conduction current in the bit line 36.

In accordance with the example before, the memory cells with conduction currents higher than 300 nA have already been identified and shut down in the earlier phases. FIG. 14(G) (curves G3 and G4) illustrate respectively the SEN signal corresponding to the two example bit lines connected respectively to memory cells with conduction currents of 220 nA and 40 nA.

Phase (8): Second Latching for Reading Out

At the end of the second predetermined sensing period T2, SEN will have decreased to some voltage depending on the conduction current in the bit line 36 (FIG. 14(G) (curves G3 and G4)). As an example, the demarcation current in this second phase is set to be at 100 nA. In this case, the memory cell with the conduction current 220 nA will have its INV latched HIGH (FIG. 14(H)) and its bit line subsequently pulled to ground (FIG. 14(I3)). On the other hand, the memory cell with the conduction current 40 nA will have no effect on the state of the latch, which was preset with LAT HIGH.

Phase (9): Read Out to the Bus

Finally, in the read out phase, the control signal NCO at the transfer gate 488 allows the latched signal SEN2 to be read out to the readout bus 499 (FIGS. 14(J) and 14(K)).

As can be seen from FIGS. 14(I1)-14(I4), the bit line voltage remains constant during each sensing period. Thus, from the discussion earlier, capacitive bit-line to bit-line coupling is eliminated.

The sense module 380 described above is one embodiment where sensing is performed with three passes, the first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes, some using only two or more A.C. passes, or only one pass. For the different passes, the demarcation current value used may be the same each time or converge progressively towards the demarcation current used in the final pass.

Figure 15:
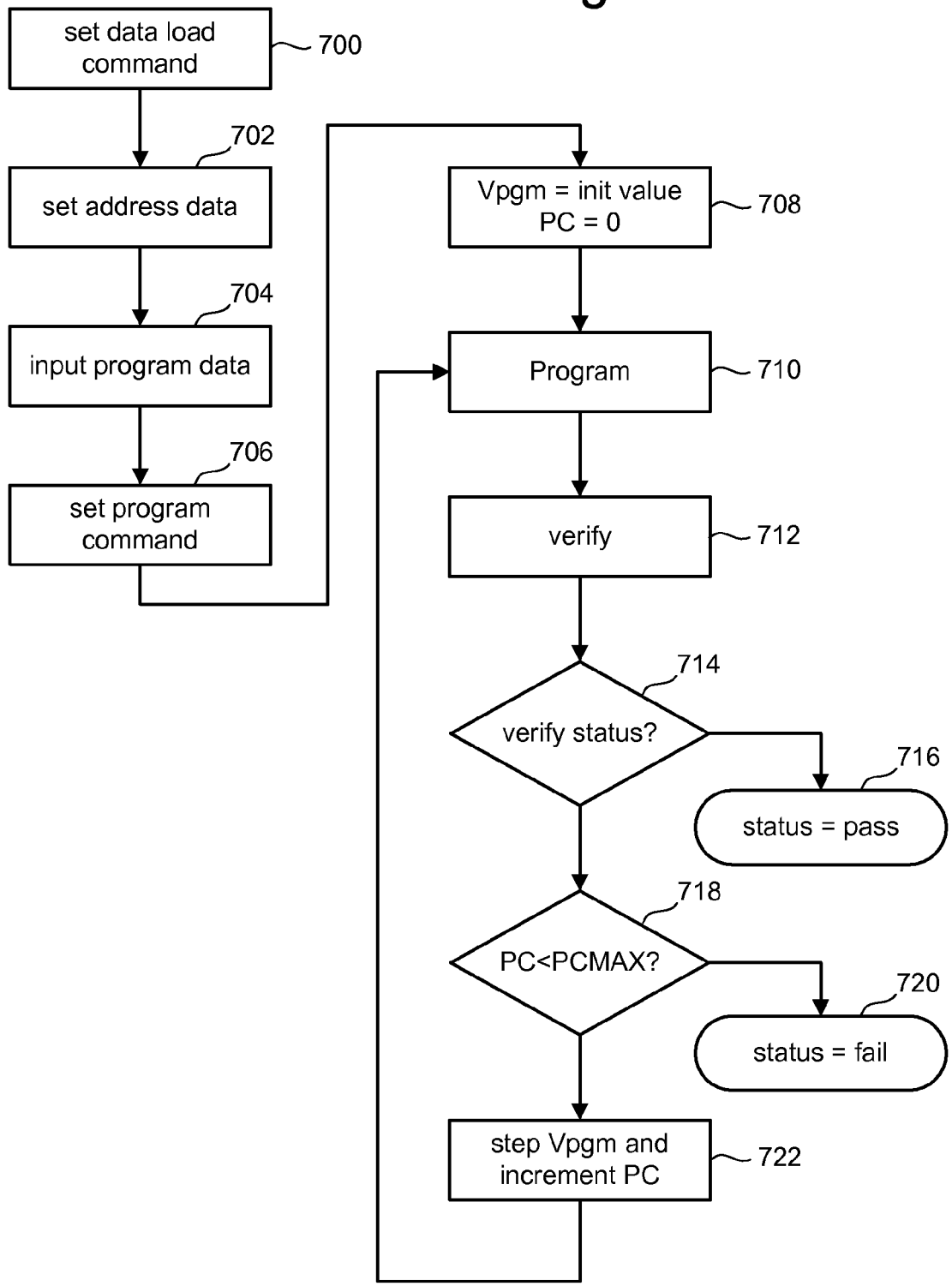
FIG. 15 is a flow chart describing one embodiment of a process for programming non-volatile memory.

FIG. 15 is a flow chart describing one embodiment of a method for programming non-volatile memory. In one implementation, memory cells are erased (in blocks or other units) prior to programming. In step 700 of FIG. 15, a "data load" command is issued by the controller and input received by control circuitry 310. In step 702, address data designating the page address is input to decoder 314 from the controller or host. In step 704, a page of program data for the addressed page is input to a data buffer for programming. That data is latched in the appropriate set of latches. In step 706, a "program" command is issued by the controller to state machine 312.

Triggered by the "program" command, the data latched in step 704 will be programmed into the selected memory cells controlled by state machine 312 using the stepped pulses of FIG. 16 applied to the appropriate word line. In step 708, the program voltage Vpgm is initialized to the starting pulse (e.g., 12V) and a program counter PC maintained by state machine 312 is initialized at 0. In step 710, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

In step 712, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected cells have been programmed. In step 714, it is checked whether all of the data latches are storing logic "1." If so, the programming process is complete and successful because all selected memory cells were programmed and verified. A status of "PASS" is reported in step 716.

If, in step 714, it is determined that not all of the data latches are storing logic "1," then the programming process continues. In step 718, the program counter PC is checked against a program limit value PCMAX. One example of a program limit value is 20; however, other numbers can also be used. If the program counter PC is not less than 20, then the program process has failed and a status of "FAIL" is reported in step 720. If the program counter PC is less than 20, then the Vpgm level is increased by the step size and the program counter PC is incremented in step 722. After step 722, the process loops back to step 710 to apply the next Vpgm pulse.

At the end of a successful program process, the threshold voltages of the memory cells should be within one or more distributions of threshold voltages for programmed memory cells or within a distribution of threshold voltages for erased memory cells, as appropriate. FIG. 17 illustrates threshold voltage distributions for the memory cell array when each memory cell stores two bits of data. FIG. 17 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 17 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 17 shows four states, the present invention can also be used with other multi-state structures including those that include more or less than four states.

FIG. 17 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 17 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. The process depicted in FIG. 15, using the control gate voltage sequence depicted in FIG. 16, will then be used to program memory cells directly into states A, B or C. While some memory cells are being programmed from state E to state A, other memory cells are being programmed from state E to state B and/or from state E to state C. When programming from state E to state C on WLn, the amount of coupling to the adjacent floating gate under WLn−1 is a maximum since the change of voltage on the floating gate under WLn is large. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent cell on WLn.

FIG. 18 illustrates an example of a two-pass technique of programming a multi-state memory cell that stores data for two different pages: a lower page and an upper page. Four states are depicted: state E (11), state A (10), state B (O) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 730. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 734. If the cell had been programmed into state A as a result of the first programming pass, then the memory cell is further programmed in the second pass so that the threshold voltage is increased to be within state B, as depicted by arrow 732. The result of the second pass is to program the cell into the state designated to store a logic "0" for the upper page without changing the data for the lower page. In both FIG. 17 and FIG. 18 the amount of coupling to the floating gate under the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 19A:
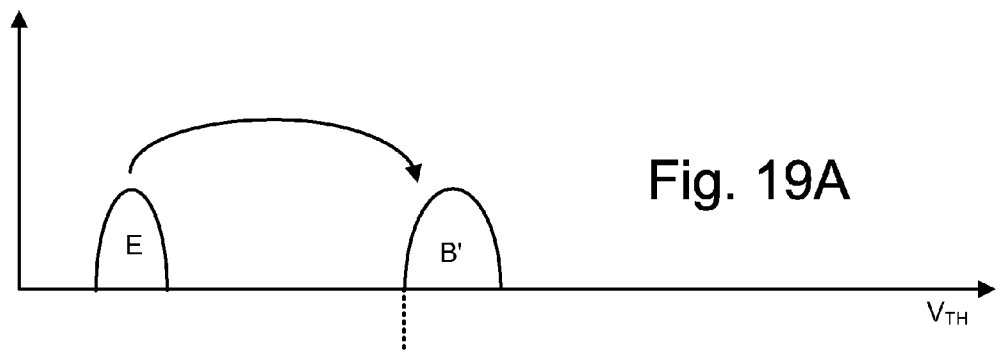
FIGS. 19A-C show various threshold voltage distributions and describe a process for programming non-volatile memory.
Figure 19B:
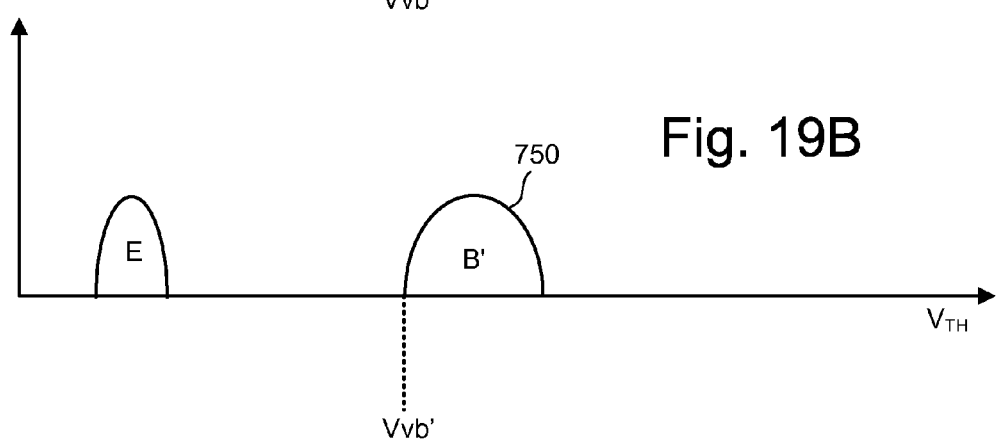
Figure 19C:
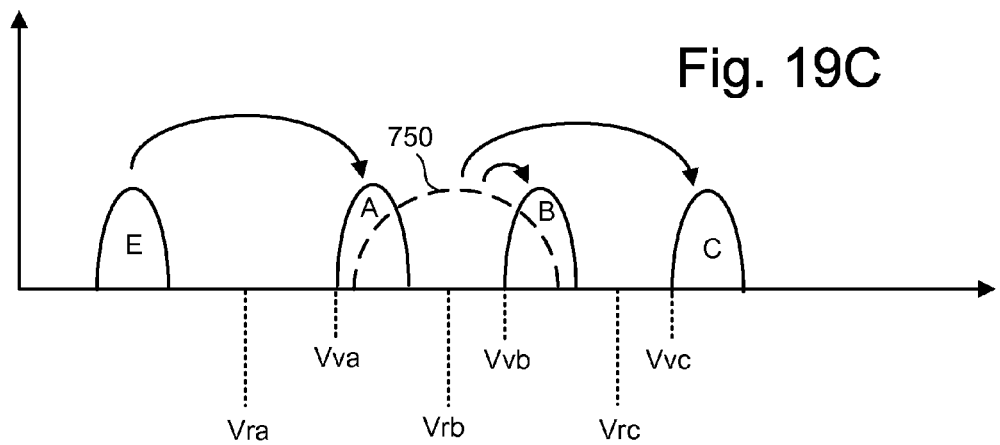

FIGS. 19A-C disclose another process for programming non-volatile memory that reduces floating gate to floating gate coupling by, for any particular memory cell, writing to that particular memory cell with respect to a particular page subsequent to writing to adjacent memory cells for previous pages. In one example of an implementation of the process taught by FIGS. 19A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIG. 19, the upper page stores bit 0 and the lower page stores bit 1. With reference to state B, the upper page stores bit 1 and the lower page stores bit 0. With reference to state C, both pages store bit data 0. The programming process of FIG. 19 is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 19A therefore shows the programming of memory cells from state E to state B'. State B' depicted in FIG. 19A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, looking back at FIG. 2, after the lower page for memory cell 106 is programmed, the lower page for memory cell 104 would be programmed. After programming memory cell 104, the floating gate to floating gate coupling effect will raise the apparent threshold voltage of memory cell 106 if memory cell 104 had a threshold voltage raised from state E to state B'. This will have the effect of widening the threshold voltage distribution for state B' to that depicted as threshold voltage distribution 750 of FIG. 19B. This apparent widening of the threshold voltage distribution will be remedied when programming the upper page.

FIG. 19C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 750 and the upper page data is to remain at 1, then the memory cell will be programmed to final state B. If the memory cell is in intermediate threshold voltage distribution 750 and the upper page data is to become data 0, then the threshold voltage of the memory cell will be raised so that the memory cell is in state C. The process depicted by FIGS. 19A-C reduces the effect of floating gate to floating gate coupling because only the upper page programming of neighbor memory cells will have an effect on the apparent threshold voltage of a given memory cell.

An example of an alternate state coding is to move from distribution 750 to state C when the upper page data is a 1, and to move to state B when the upper page data is a 0.

Although FIGS. 19A-C provide an example with respect to four data states and two pages of data, the concepts taught by FIGS. 19A-C can be applied to other implementations with more or less than four states and different than two pages.

FIGS. 20A-F depict various tables that describe the order of programming according to various embodiments for the methods described by FIGS. 17, 18 and 19. As described above, each block includes a set of bit lines forming columns and a set of word lines forming rows. In one embodiment, the bit lines are divided into odd bit lines and even bit lines. Memory cells along a common word line and connected to the odd bit lines are programmed at one time, while memory cells along a common word line and connected to even bit lines are programmed at another time ("odd/even programming"). In another embodiment, memory cells are programmed along a word line for all bit lines in the block ("all bit line programming"). In other embodiments, the bit lines or block can be broken up into other groupings (e.g., left and right, more than two groupings, etc.).

FIG. 20A is a table which describes the order for programming memory cells along a bit line for all bit line programming. In this embodiment, the block with four word lines includes four pages (page 0-3). Page 0 is written first, followed by page 1, followed by page 2 and then followed by page 3. The data in page 0 includes the data stored by all the memory cells connected to word line WL0. The data in page 1 includes the data stored by the memory cells connected to word line WL1. The data in page 2 includes the data stored by memory cells connected to WL2. The data in page 3 includes the data stored by memory cells connected to word line WL3. The embodiment of FIG. 20A assumes full sequence programming, as described above with respect to FIG. 17.

In another embodiment of full sequence programming, the data can be written first to even bit lines and then to odd bit lines. FIG. 20B depicts the order of programming even and odd bit lines when using the full sequence programming method described above with respect to FIG. 17. In this embodiment, a block with four word lines includes eight pages of data. The memory cells on even bit lines connected to word line WL0 store data for page 0. Memory cells on odd bit lines connected to word line WL0 store data for page 1. Memory cells on even bit lines connected to word line WL1 store data for page 2. Memory cells on odd bit lines connected to word line WL1 store data for page 3. Memory cells on even bit lines connected to word line WL2 store data for page 4. Memory cells on odd bit lines connected to word line WL2 store data for page 5. Memory cells on even bit lines connected to word line WL3 store data for page 6. Memory cells on odd bit lines connected to word line WL3 store data for page 7. Data is programmed in numerical order according to page number, from page 0 to page 7.

The table of FIG. 20C describes the order for programming according to the two phase programming process of FIG. 18 for a memory array that performs all bit line programming. A block with four word lines is depicted to include eight pages. For memory cells connected to word line WL0, the lower page of data forms page 0 and the upper page data forms page 1. For memory cells connected to word line WL1, the lower page of data forms page 2 and the upper page data forms page 3. For memory cells connected to word line WL2, the lower page of data forms page 4 and the upper page data forms page 5. For memory cells connected to word line WL3, the lower page of data forms page 6 and the upper page data forms page 7. Data is programmed in numerical order according to page number, from page 0 to page 7.

FIG. 20D provides a table describing the order of programming the two-phase programming process of FIG. 18 for a memory architecture that performs odd/even programming. A block with four word lines includes 16 pages, where the pages are programmed in numerical order according to page number, from page 0 to page 15. For memory cells on even bit lines connected to word line WL0, the lower page of data forms page 0 and the upper page data forms page 2. For memory cells on odd bit lines connected to word line WL0, the lower page of data forms page 1 and the upper page of data forms page 3. For memory cells on even bit lines connected to word line WL1, the lower page forms page 4 and the upper page forms page 6. For memory cells on odd bit lines connected to word line WL1, the lower page forms page 5 and the upper page forms page 7. For memory cells on even bit lines connected to word line WL2, the lower page forms page 8 and the upper page forms page 10. For memory cells on odd bit lines connected to word line WL2, the lower page forms page 9 and the upper page forms page 11. For memory cells on even bit lines connected to word line WL3, the lower page forms page 12 and the upper page forms page 14. For memory cells on odd bit lines connected to word line WL3, the lower page forms page 13 and the upper page forms page 15. Alternately, as in FIG. 20E, both lower and upper pages under each wordline of the even bitlines are programmed before programming both pages of the odd bit lines for this same word line.

FIGS. 20F and 20G describe the order for programming memory cells utilizing the programming method of FIGS. 19A-C. FIG. 20F pertains to the architecture that performs all bit line programming. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed in numerical order according to page number, from page 0 to page 7.

The table of FIG. 20G pertains to the architecture that performs odd/even programming. For memory cells on even bit lines connected to word line WL0, the lower page forms page 0 and the upper page forms page 4. For memory cells on odd bit lines connected to word line WL0, the lower page forms page 1 and the upper page forms page 5. For memory cells on even bit lines connected to word line WL1, the lower page forms page 2 and the upper page forms page 8. For the memory cells on odd bit lines connected to word line WL1, the lower page forms page 3 and the upper page forms page 9. For the memory cells on even bit lines connected to word line WL2, the lower page forms page 6 and the upper page forms page 12. For the memory cells on odd bit lines connected to word line WL2, the lower page forms page 7 and the upper page forms page 13. For the memory cells on even bit lines connected to word line WL3, the lower page forms page 10 and the upper page forms page 14. For the memory cells on odd bit lines connected to word line WL3, the lower page forms page 11 and the upper page forms page 15. Memory cells are programmed in numerical order according to page number, from page 0 to page 15. Finally, each of the architectures having both even and odd bit lines can be implemented with all the even bit lines located physically together in, for example, the left side of the chip, and all of the odd bit lines located together in, for example, the right side of the chip.

Note that in the embodiments of FIGS. 20A-G, memory cells are programmed along a NAND string from source side to the drain side. Also, the tables depict only an embodiment with four word lines. The various methods depicted within the tables can be applied to systems with more or less than four word lines. Examples of an architecture using odd/even programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; U.S. Pat. No. 6,771,536; U.S. Pat. No. 6,781,877.

Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming.

Figure 21:
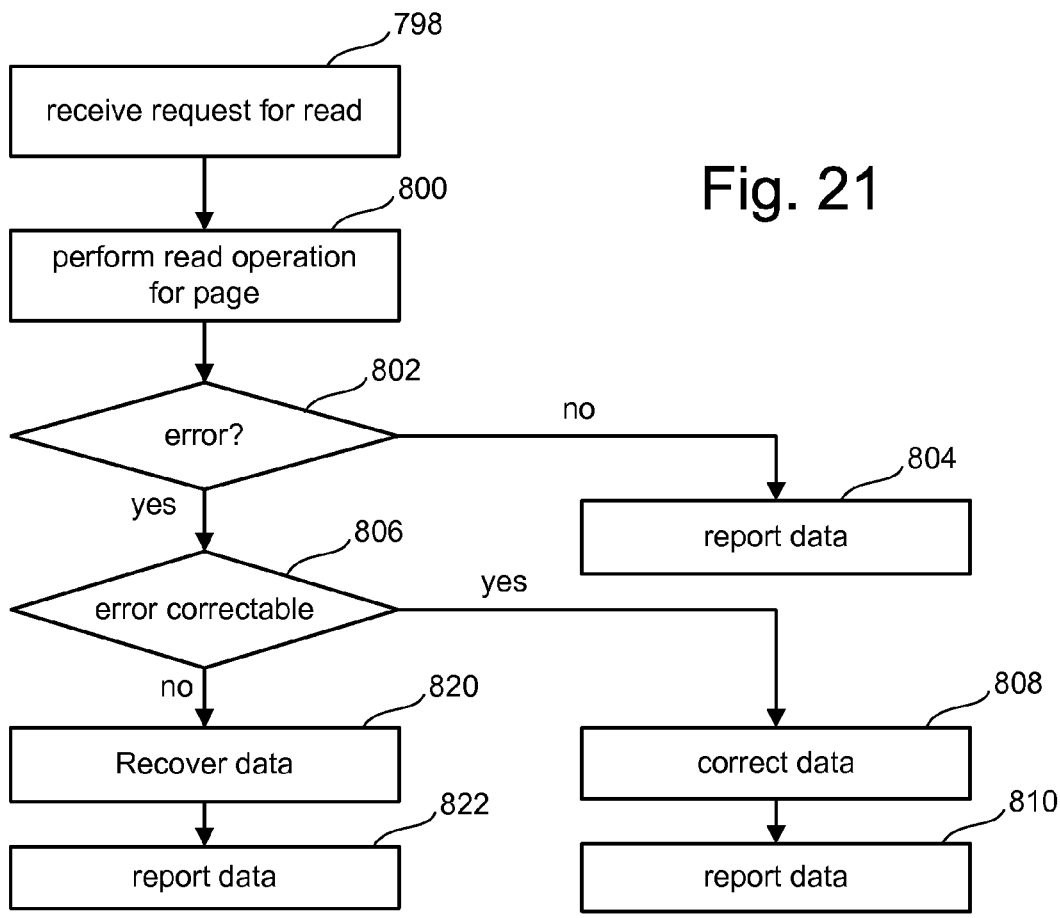
FIG. 21 is a flow chart describing one embodiment of a process for reading non-volatile memory.

FIG. 21 is a flow chart describing one embodiment for reading data from non-volatile memory cells. The discussion above with respect to the sense modules discusses how data is read from particular bit lines. FIG. 21 provides the read process at the system level. At step 800, a read operation is performed for a particular page in response to a request to read data (step 798). In one embodiment, when data for a page is programmed, the system will also create Error Correction Codes (ECCs) and write those ECCs with the page of data. ECC technologies are well known in the art. The ECC process used can include any suitable ECC process known in the art. When reading data from a page, the ECCs will be used to determine whether there are any errors in the data (step 802). The ECC process can be performed on he controller, the state machine or elsewhere in the system. If there are no errors in the data, the data is reported to the user at step 804. For example, data will be communicated to a controller or host via data I/O lines 320. If an error is found at step 802, it is determined whether the error is correctable (step 806). The error may be due to the floating gate to floating gate coupling effect or possibly to other physical mechanisms. Various ECC methods have the ability to correct a predetermined number of errors in a set of data. If the ECC process can correct the data, then the ECC process is used to correct that data in step 808 and the data, as corrected, is reported to the user in step 810. If the data is not correctable by the ECC process, a data recovery process is performed in step 820. In some embodiments, an ECC process will be performed after step 820. More details about the data recovery process are described below. After the data is recovered, that data is reported at step 822. Note that the process of FIG. 21 can be used with data programmed using all bit line programming or odd/even bit line programming.

Figure 22:
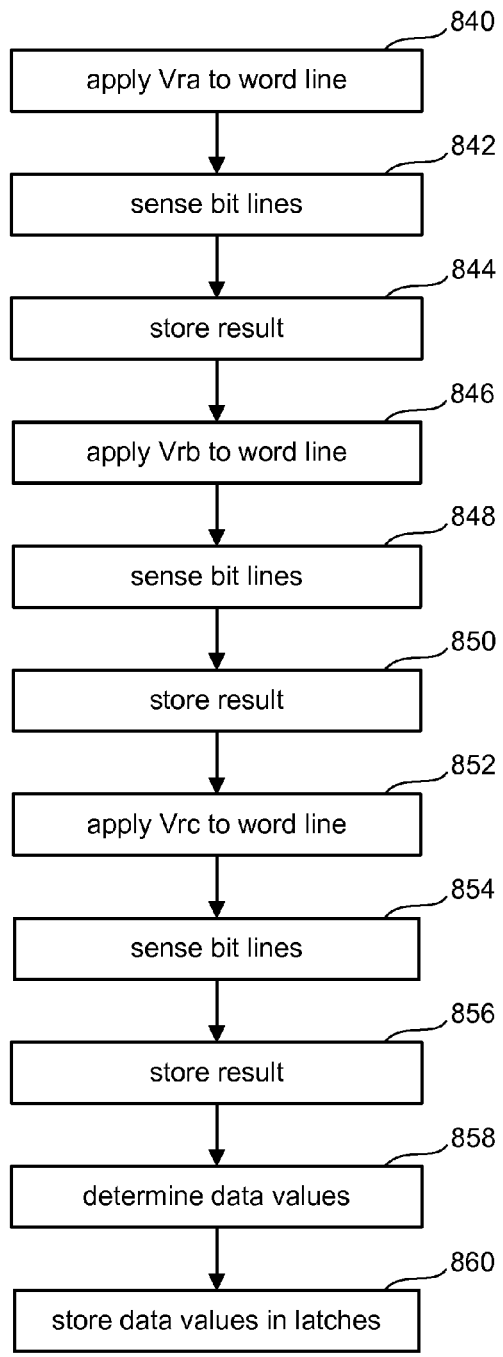
FIG. 22 is a flow chart describing one embodiment of a process for performing a read operation for non-volatile memory.

FIG. 22 is a flow chart describing one embodiment of a process for performing a read operation for a page (see step 800 of FIG. 21). The process of FIG. 22 can be performed for a page that encompasses all bit lines of a block, only odd bit lines of a block, only even bit lines of a block, or other subsets of bit lines of a block. In step 840, read reference voltage Vra is applied to the appropriate word line associated with the page. In step 842, the bit lines associated with the page are sensed to determine whether the addressed memory cells conduct or do not conduct based on the application of Vra to their control gates. Bit lines that conduct indicate that the memory cells were turned on; therefore, the threshold voltages of those memory cells are below Vra (e.g., in state E). In step 844 the result of the sensing for the bit lines is stored in the appropriate latches for those bit lines. In step 846, read reference voltage Vrb is applied to the word lines associated with the page being read. In step 848, the bit lines are sensed as described above. In step 850, the results are stored in the appropriate latches for the bit lines. In step 852, read reference voltage Vrc is applied to the word lines associated with the page. In step 854, the bit lines are sensed to determine which memory cells conduct, as described above. In step 856, the results from the sensing step are stored in the appropriate latches for the bit lines. In step 858, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 392. In step 860, processor 392 will store the determined data values in the appropriate latches for each bit line. In other embodiments, sensing the various levels (Vra, Vrb, and Vrc) may occur in different orders.

Figure 23:
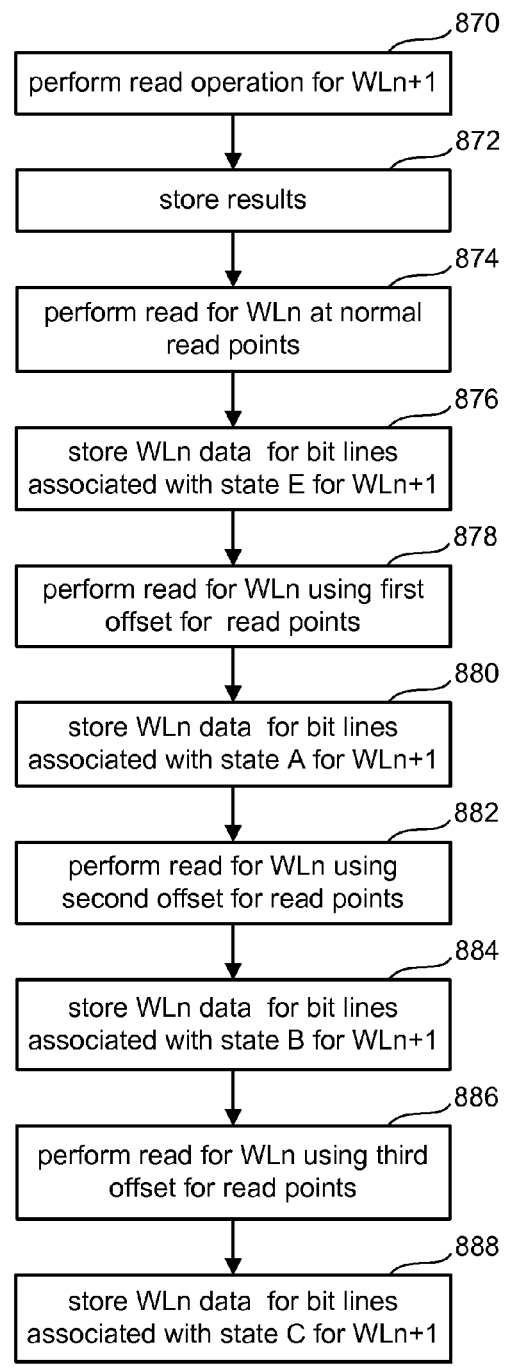
FIG. 23 is a flow chart describing one embodiment of a process for recovering data.

FIG. 23 includes a flow chart describing one embodiment of a process for recovering data (step 820). Data may include an error due to the floating gate to floating gate coupling effect. The process of FIG. 23 attempts to read the data while compensating for the floating gate to floating gate coupling effect. The compensation includes looking at the neighboring word line and determining how the past programming of the neighboring word line has created a floating gate to floating gate coupling effect. For example, when reading data on word line WLn, the process will also read the data of word line WLn+1. If the data on word line WLn+1 has disturbed the data on WLn, then the read process will compensate for that disturb. In general, the method proposed here uses different offsets (e.g., 0V, 0.1V, 0.2V, 0.3V) to the read reference voltages as a function of the state of the memory cell on the neighbor word line.

The process depicted in FIG. 23 applies to the full sequence programming described above with respect to FIG. 17 in which two bits of one logical page are stored in each cell and will be read and reported out together. If the memory cell on the neighboring word line is in state E, there will be no floating gate to floating gate coupling effect. If the memory cell on the neighboring word line is in state A, there will be a small coupling effect. If the memory cell on the neighboring word line is in state B, there will be a medium floating gate to floating gate coupling effect. If the memory cell on the neighboring word line is in state C, there will be a larger floating gate to floating gate coupling effect. The exact coupling effect due to the neighboring word line varies by array implementation and can be determined by characterizing the device. In one embodiment, the floating gate to floating gate coupling effect due to a neighbor cell being in state A is an apparent 0.1 volt shift in threshold voltage. The floating gate to floating gate coupling effect due to a neighbor memory cell in state B is an apparent 0.2 volt shift in threshold voltage. The floating gate to floating gate coupling effect due to a neighboring memory cell in state C is an apparent 0.3 volt shift in threshold voltage. The technology described herein is not limited to any one set of values for this effect and will vary based on the implementation.

Step 870 in FIG. 23 includes performing a read operation for the neighboring word line WLn+1. This includes performing the process of FIG. 22 for the neighboring word line. For example, if a page in word line WL1 is being read, then step 870 includes performing the process of FIG. 22 on word line WL2. The results of step 870 are stored in the appropriate latches in step 872. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1. In step 874, a read operation is performed for the word line of interest WLn at the normal read points. This includes performing the process of FIG. 22 using Vra, Vrb and Vrc. In some embodiments, the levels and/or the number of levels used to read WLn+1 may not be exactly the same as those used initially to read WLn and simply some approximation of the floating gate threshold value is sufficient for WLn correction purposes. The results of step 874 are stored in the appropriate latches for bit lines with memory cells where neighbor cell WLn+1 was determined (in step 870) to be in state E. For other bit lines, the data will be disregarded. In step 878, a read operation will be performed for the word line of interest using a first set of offsets for the read points. That is, the process of FIG. 22 will be performed; however, rather than using Vra, Vrb and Vrc, the system will use Vra+0.1V, Vrb+0.1V and Vrc+0.1V. In step 888, the results of step 878 will be stored for bit lines with memory cells having neighboring memory cells (e.g., WLn+1) in state A. Data for other bit lines will be disregarded. In step 882, a read operation will be performed for the word line of interest using a second offset. The process of FIG. 22 will be performed; however, the read reference points will be Vra+0.2V, Vrb+0.2V and Vrc+0.2V. In step 884, the results of step 882 will be stored in latches for those bit lines with memory cells having neighbors (e.g., WLn+1) in state B. In step 886, the read operation will be performed for the word line of interest using a third offset. Thus, the process of FIG. 22 will use Vra+0.3V, Vrb+0.3V and Vrc+0.3V as the read compare points. At step 880, the results of step 886 will be stored for those bit lines having memory cells whose neighboring cells (e.g., WLn+1) are in state C.

In the discussion above, the process of FIG. 23 is performed as part of the data recovery step 820 of FIG. 21. In another embodiment, the process of FIG. 23 can be used as the initial read process that is performed in response to a request to read data.

Figure 24:
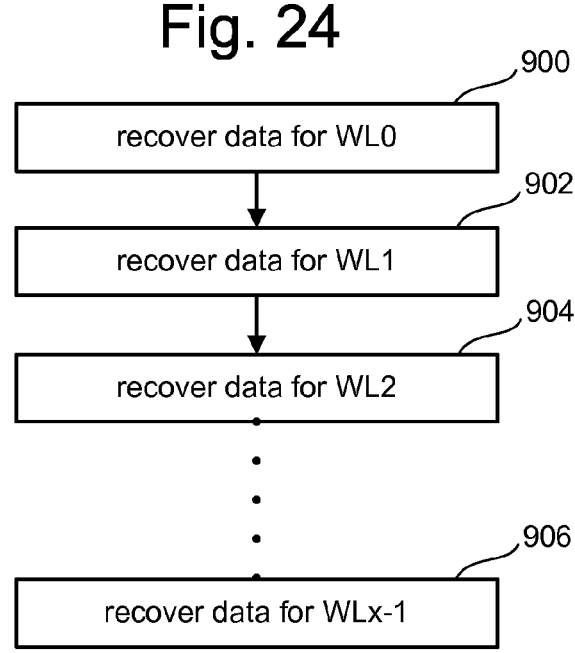
FIG. 24 is a flow chart describing one embodiment of a process for recovering data from multiple word lines.

FIG. 24 is a flow chart indicating that the data recovery process (the method of FIG. 23) can be performed for all the word lines of a block except for the last word line to be programmed. For example, if there are X+1 word lines, the recovery process can be used for word lines WL0 through WLx−1. It would not be necessary to perform the recovery process for word line WLx (e.g., the word line closest to the drain) because that word line has no neighbor that was programmed after it that would cause the floating gate to floating gate coupling effect. Although FIG. 24 shows an embodiment with a recovery process performed for all the word lines sequentially, in one embodiment described above with respect to FIG. 21, the recovery process can be performed for the word lines at separate times and only if there were ECC errors that were not correctable.

The above-described methods of FIGS. 22 and 23 were discussed with respect to the full sequence programming storing two bits of one logical page of FIG. 17. These processes can be slightly modified when reading data that was programmed according to the two-step process of FIG. 18 storing one bit from each of two logical pages. For example, when performing the standard read operation (step 800 of FIG. 21), reading the lower page would require applying Vra and Vrc to the control gates of the memory cells and sensing at those read points to determine whether the data is in state E/C (data 1) or states A/B (data 0) for the lower page. Thus, FIG. 22 would be modified by performing only steps 840, 842, 844 and steps 852-860 for a lower page read. For performing a read of the upper page, read compare point Vrb would be used to determine whether upper page data is for state E/A (data 1) or states B/C (data 0). Therefore, for an upper page read, the process of FIG. 22 would be amended to perform only steps 846, 848, 850, 858 and 860. Additionally, when recovering data (step 820), the process would perform the method of FIG. 25 for recovering data for a lower page and the process of FIG. 26 to recover data for an upper page.

Figure 25:
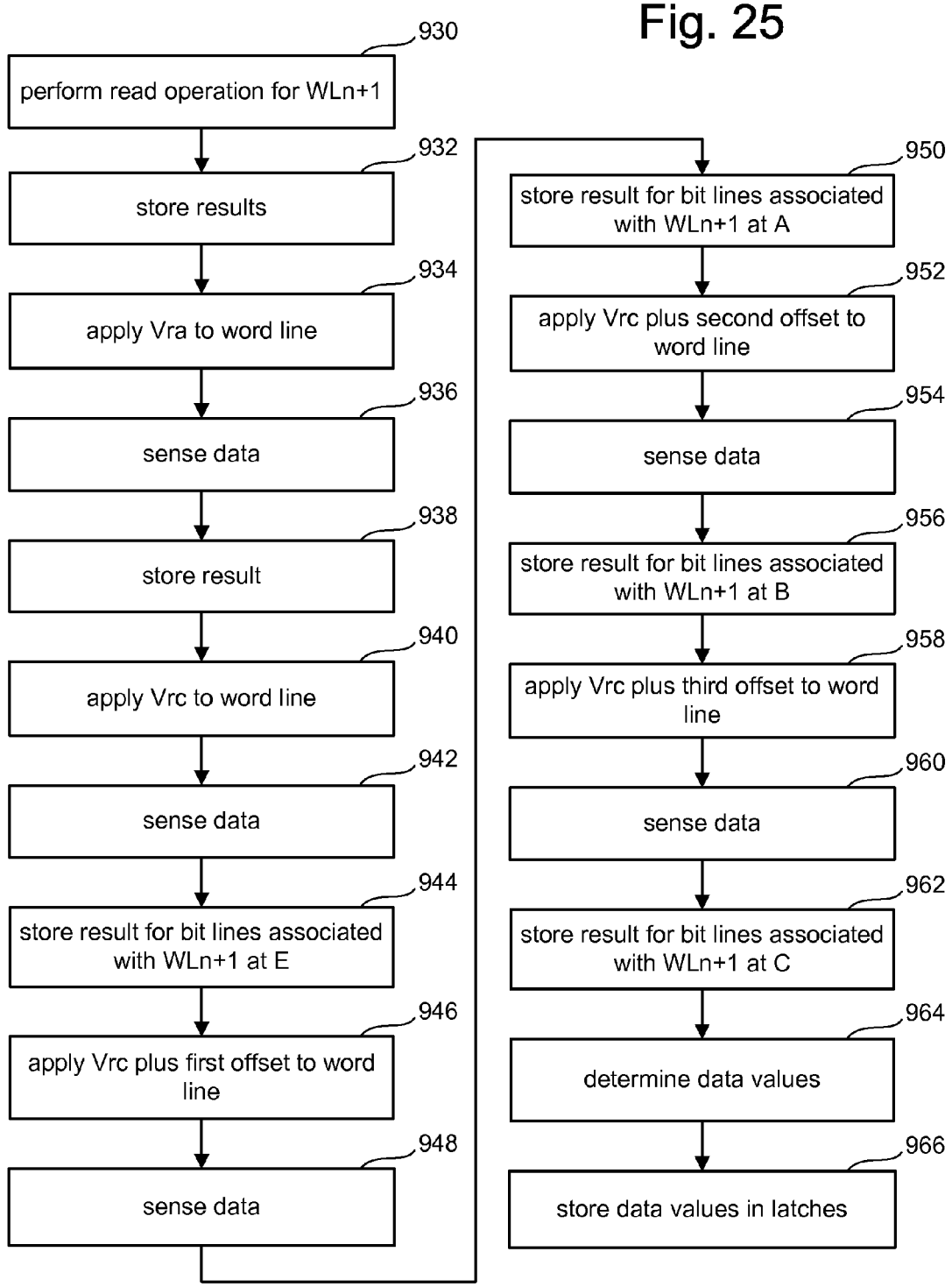
FIG. 25 is a flow chart describing one embodiment of a process for reading data from a lower page.

In step 930 of FIG. 25, a read operation is performed for the neighboring word line WLn+1 according to the method of FIG. 22. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1. The results of that read operation are stored in the appropriate latches in step 932. In step 934, read reference voltage Vra is applied to the word line. In step 936, the data for the bit lines are sensed. In step 938, the results are stored in the appropriate latches. In step 940, read reference voltage Vrc is applied to the word line. In step 942, data is sensed as discussed above. In step 944, the results of the sense step 942 will be stored for bit lines associated with a neighboring cell storing data in state E. In step 946, Vrc plus a first offset (e.g., 0.1 volts or another suitable value) will be applied to the word line for the page being read. In step 948, the data will be sensed as discussed above. In step 950, the results of step 948 will be stored for bit lines associated with neighboring cells storing data in state A. Data for other bit lines will be discarded. In step 952, Vrc plus a second offset (e.g., 0.2 volts or other suitable value) will be applied to the word line associated with the page being read. In step 954, data will be sensed using the sense modules, as described above. In step 956, the results of step 954 will be stored for bit lines associated with neighboring cells storing data in state B. In step 958, Vrc plus a third offset (0.3 volts or other suitable value) will be applied to the word lines associated with the page being read. In step 960, the sense module will be used to sense the data as described above. In step 962, the results of step 960 will be stored for those bit lines associated with neighboring cells storing data in state C. In step 964, processor 392 will determine the data values based on the data stored from the sensing steps. In step 966, the determined data values from step 964 will be stored in latches for eventual communication to the user requesting the read data. In another embodiment, steps 934-938 associated with state A could be performed between steps 962 and 964.

Note that in the process described by FIG. 25, offsets are only applied to Vrc to separate state B from state C. It is implicitly assumed that offsets are not needed when reading at Vra because the usually negative threshold of the erase state, though affected by WLn+1, is separated sufficiently far from state A as to not need correction. While this is a practical assumption for current generation memories, it may not be true in future generation memories, and the offset processes described with respect to Vrc in steps 946-962 may be added to Vra before step 940.

When determining the data values in step 964, if a memory cell conducts in response to Vra, the lower page data is "1." If the memory cell does not conduct in response to Vra and does not conduct in response to Vrc (or Vrc plus the appropriate offset), then the lower page data is also "1." If the memory cell does not conduct in response to Vra, but does conduct in response to Vrc (or Vrc plus the appropriate offset), then the lower page data is "0."

Figure 26:
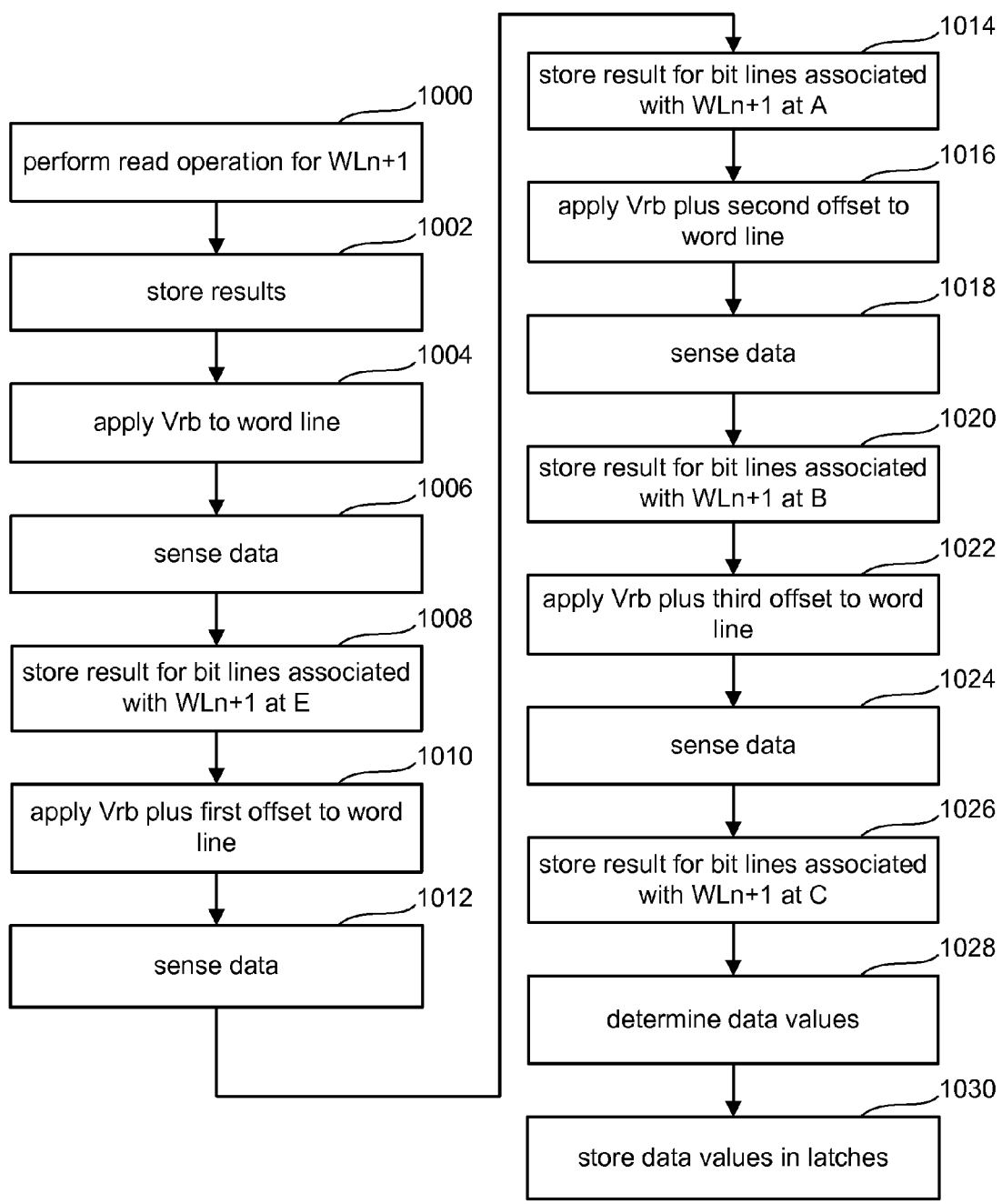
FIG. 26 is a flow chart describing one embodiment of a process of reading data from an upper page.

The process of FIG. 26 is used to read or recover data for the upper page. In step 1000, a read operation is performed for the neighboring word line WLn+1 using the method of FIG. 22. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1. In step 1002, the results of step 1000 are stored in the appropriate latches for each of the bit lines. In step 1004, read reference voltage Vrb is applied to the word line associated with the page being read. In step 1006, sense modules are used to sense the data as described above. In step 1008, the results of step 1006 are stored for those bit lines associated with neighboring memory cells storing data in state E. In step 1010, Vrb plus a first offset (e.g., 0.1V or some other suitable value) is applied to the word line. In step 1012, data is sensed, as described above. In step 1014, results from step 1012 are stored for those bit lines associated with neighboring cells storing data in state A. In step 1016, Vrb plus a second offset (e.g., 0.2V or another suitable value) is applied to the word line associated with the page being read. In step 1018, data is sensed as described above. In step 1020, results from step 1018 are stored for those bit lines associated with a neighboring cell in state B. In step 1022, Vrb plus a third offset (0.3V or another suitable value) is applied to the word line associated with the page being read. In step 1024, data is sensed as described above. In step 1026, results of step 1024 are stored for those bit lines associated with neighboring memory cells storing data in state C. In step 1028, processor 392 determines the data values based on the stored sensed data. If a memory cell turned on in response to Vrb (or Vrb plus the appropriate offset), then the upper page data is "1." If a memory cell does not turn on in response to Vrb (or Vrb plus the appropriate offset), then the upper page data is "0." In step 1030, the data values determined by processor 392 are stored in the data latches for communication to the user.

In another embodiment, rather than using the methods of FIGS. 25 and 26 to recover data, the methods of FIGS. 25 and 26 can be used for the initial data reads performed in response to a request to read data.

FIGS. 25 and 26 are for reading data that are programmed using the upper page and lower page process of FIG. 18. These two methods of FIGS. 25 and 26 can be used to read data programmed by all bit line programming or odd/even bit line programming. When used with all bit line programming, all bit lines are read simultaneously. When used with odd/even bit line programming, even bit lines are read simultaneously at a first time and odd bit lines are read simultaneously at a different time.

FIGS. 27-36 describe processes used to read data that is programmed according to the method associated with FIGS. 19A-C. The process of FIG. 27 can be implemented as an overall process for reading data that is performed in response to a read request for a particular one or more pages (or other grouping) of data prior to, separate from and/or in conjunction with using ECCs. In other embodiments, the process of FIG. 27 can be performed as part of data recovery step 820 of FIG. 21. When reading data as programmed according to the process of FIG. 19, any perturbation from floating gate to floating gate coupling due to programming the lower page of neighboring cells is corrected when programming the upper page of the cell under question. Therefore, when attempting to compensate for floating gate to floating gate coupling effect from neighboring cells, the process need only consider the coupling effect due to the programming of the upper page of neighboring cells. Thus, in step 1060 of FIG. 27, the process reads upper page data for the neighboring word line. If the upper page of the neighboring word line was not programmed (step 1062), then the page under consideration can be read without compensating for the floating gate to floating gate coupling effect (step 1064). If the upper page of the neighboring word line was programmed (step 1062), then the page under consideration should be read using some compensation for the floating gate to floating gate coupling effect in step 1066. In some embodiments, the read operation performed for neighboring word line results in a determination of charge levels on the neighboring word line, which may or may not accurately reflect the data stored thereon.

In one embodiment, a memory array implementing the programming process of FIG. 19 will reserve a set of memory cells to store one or more flags. For example, one column of memory cells can be used to store flags indicating whether the lower page of the respective rows of memory cells has been programmed and another column of memory cells can be used to store flags indicating whether the upper page for the respective rows of memory cells has been programmed. In some embodiments, redundant cells can be used to store copies of the flag. By checking the appropriate flag, it can be determined whether the upper page for the neighboring word line has been programmed. More details about such a flag and the process for programming can be found in U.S. Pat. No. 6,657,891, Shibata et al., "Semiconductor Memory Device For Storing Multi-Valued Data," incorporated herein by reference in its entirety.

Figures 27, 31:
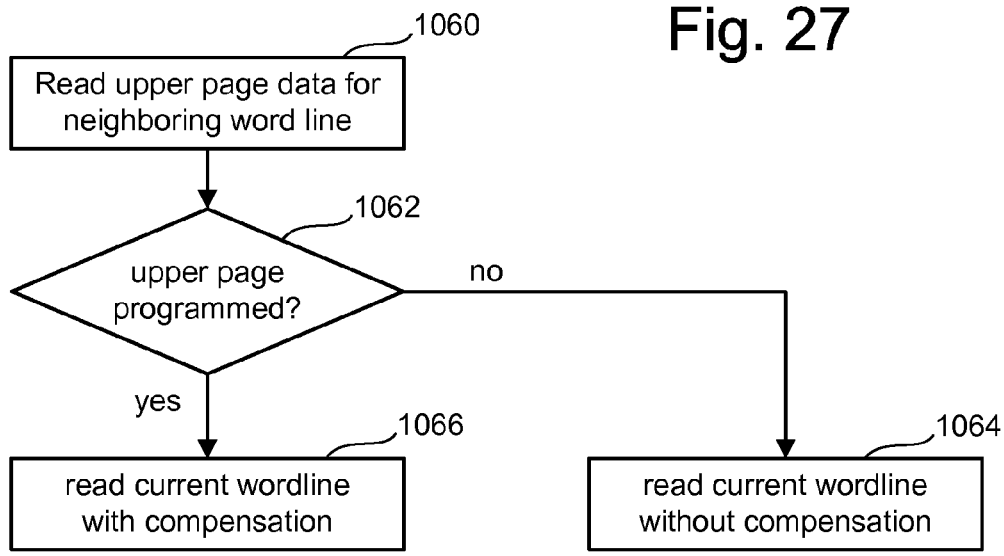
FIG. 27 is a flow chart describing one embodiment of a process for reading data.
FIG. 31 is a table depicting a process for determining data values.
Figure 28:
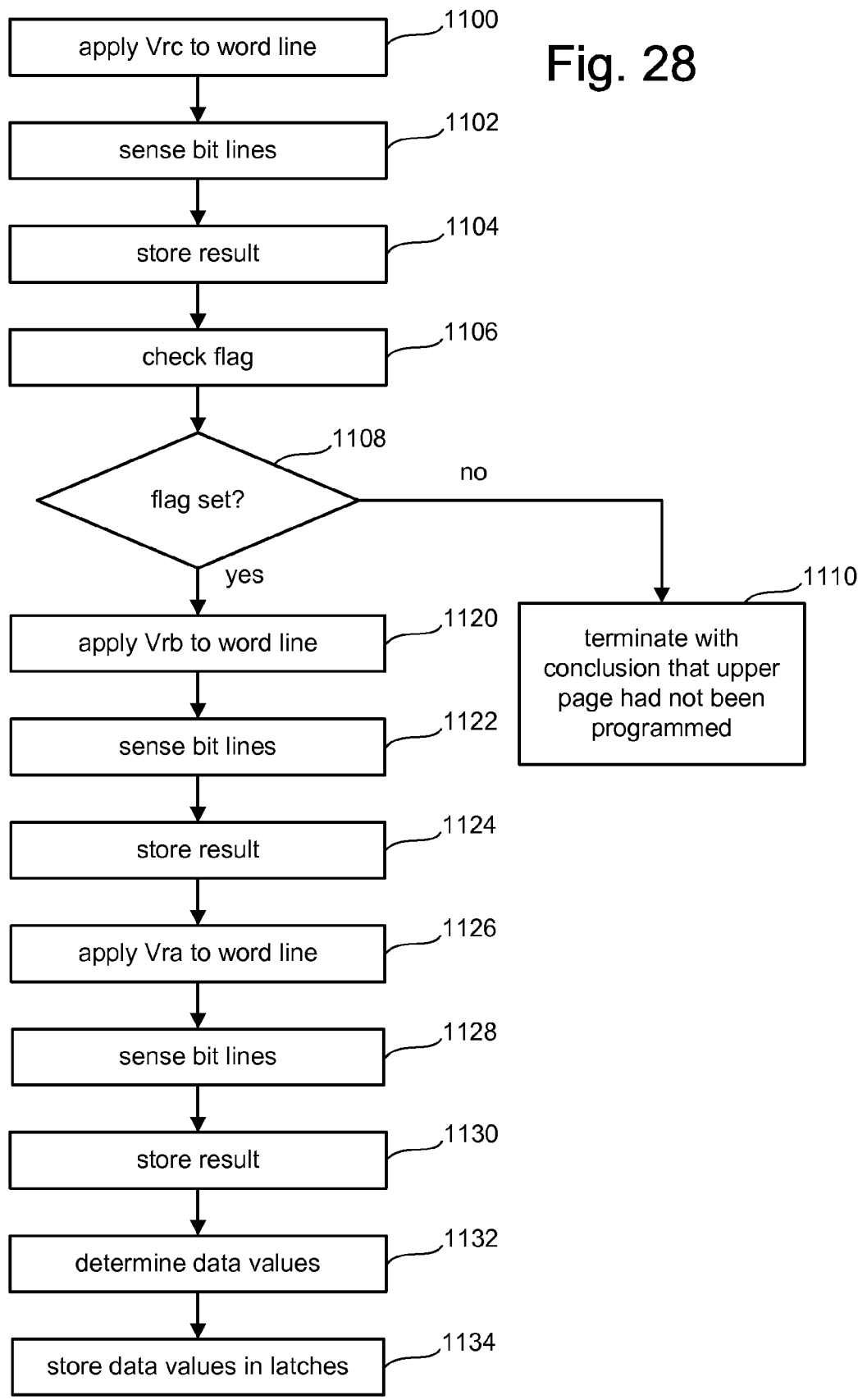
FIG. 28 is a flow chart describing one embodiment of a process for reading data from an upper page.

FIG. 28 describes one embodiment of a process for reading the upper page data for a neighboring word line (step 1060 of FIG. 27). In step 1100, read reference voltage Vrc is applied to the word line associated with the page being read. At step 1102, the bit lines are sensed as described above. In step 1104, the results of step 1102 are stored in the appropriate latches. Reading first at Vrc is chosen to uniquely determine upper page data since lower page data will normally already have been written in WLn+1 and reading at Vra or Vrb will not guarantee a unique result since distribution 750 (FIG. 19C) may overlap these values.

In step 1106, the system checks the flag indicating upper page programming associated with the page being read. In one embodiment, the memory cell storing the flag will store data in state E if the flag is not set and in state C if the flag is set. Therefore, when that particular memory cell is sensed at step 1102, if the memory cell conducts (turns on), then the memory cell is not storing data in state C and the flag is not set. If the memory cell does not conduct, then it is assumed in step 1106 that the memory cell is indicating that the upper page has been programmed.

In another other embodiment, the flag can be stored in a byte. Rather than storing all bits in state C, the byte will include a unique 8-bit code representing the flag and known to the state machine 312, such that the 8-bit code has at least one bit in state E, at least one bit in state A, at least one bit in state B and at least one bit in state C. If the upper page has not been programmed, the byte of memory cells will all be in state E. If the upper page has been programmed, then the byte of memory cells will store the code. In one embodiment, step 1106 is performed by checking whether any of the memory cells of the byte storing the code do not turn on in response to Vrc. In another embodiment, step 1106 includes addressing and reading the byte of memory cells storing the flag and sending the data to the state machine, which will verify whether the code stored in the memory cells matches the code expected by the state machine. If so, the state machine concludes that the upper page has been programmed.

If the flag has not been set (step 1108), then the process of FIG. 28 terminates with the conclusion that the upper page has not been programmed. If the flag has been set (step 1108), then it is assumed that the upper page has been programmed and at step 1120 read voltage Vrb is applied to the word line associated with the page being read. In step 1122, the bit lines are sensed as discussed above. In step 1124, the results of step 1122 are stored in the appropriate latches. In step 1126, read reference voltage Vra is applied to the word line associated with the page being read. In step 1128, the bit lines are sensed. In step 1130, the results of step 1128 are stored in the appropriate latches. In step 1132, processor 392 determines the data value stored by each of the memory cells being read based on the results of the three sensing steps 1102, 1122 and 1128. At step 1134, the data values determined in step 1132 are stored in the appropriate data latches for eventual communication to the user. In step 1132, processor 392 determines the values of the upper page and lower page data using well known simple logic techniques dependent on the specific state coding chosen. For example, for the coding described in FIG. 19, the lower page data is Vrb* (the complement of the value stored when reading at Vrb), and the upper page data is Vra* OR (Vrb AND Vrc*). The process of FIG. 20, though here described as being used to read WLn+1, can also be used to read WLn as described below. When used to read WLn+1 as in step 1160 of FIG. 27, what is desired is not simply the data but a determination of the presence of upper page data. This determination is made using the method described in FIG. 31 below. It should be noted that the values chosen for Vra, Vrb, and Vrc when reading WLn+1 may differ from those chosen when reading WLn.

Figure 29:
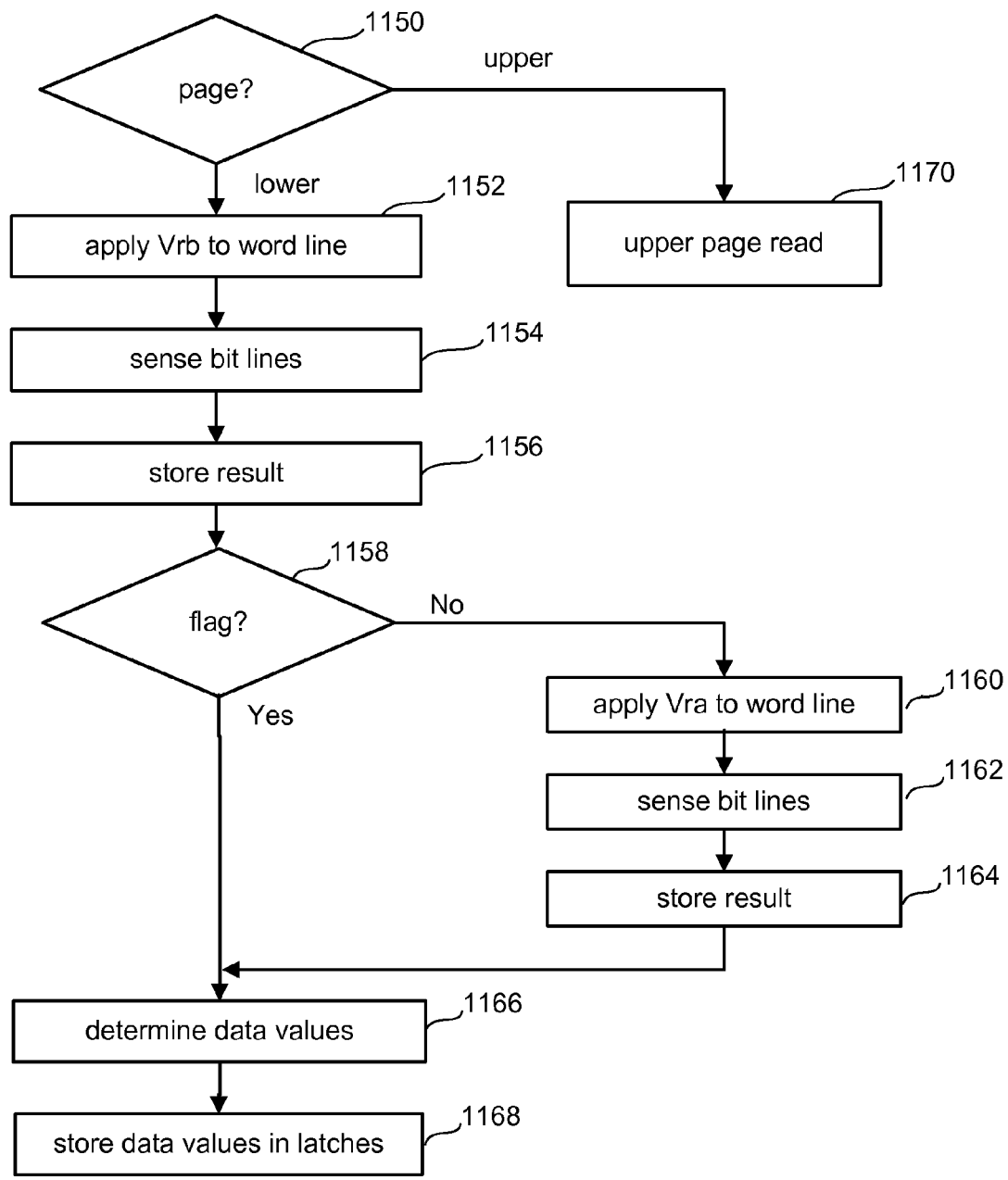
FIG. 29 is a flow chart describing one embodiment of a process for reading data without using compensation.

FIG. 29 is a flow chart describing one embodiment of a process for reading data of the word line under consideration when the system does not need to compensate for floating gate to floating gate coupling from a neighboring word line (see step 1064 of FIG. 27). In step 1150, it is determined whether the read is for the upper page or lower page associated with the word line under consideration. If the read is for the lower page, then in step 1152 read reference voltage Vrb is applied to the word line associated with the page being read. In step 1154, the bit lines are sensed. In step 1156, the results of sensing step 1154 are stored in the appropriate latches. In step 1158, the flag is checked to determine if the page contains upper page data. If there is no flag, then any data present will be in the intermediate state and Vrb was the incorrect threshold to use and the process continues at step 1160. In step 1160, Vra is applied to the word line, the bit lines are re-sensed at step 1162, and in step 1164 the result is stored. In step 1166 (after either step 1164, or step 1158 if the flag is set, processor 392 determines a data value to be stored. In one embodiment, when reading the lower page, if the memory cell turns on in response to Vrb (or Vra) being applied to the word line, then the lower page data is "1"; otherwise, the lower page data is "0."

If it is determined that the page address corresponds to the upper page (step 1150), an upper page read process is performed at step 1170. In one embodiment, the upper page read process of step 1170 includes the same method described in FIG. 28, which includes reading the flag and all three states since an unwritten upper page may be addressed for reading, or another reason.

Figure 30:
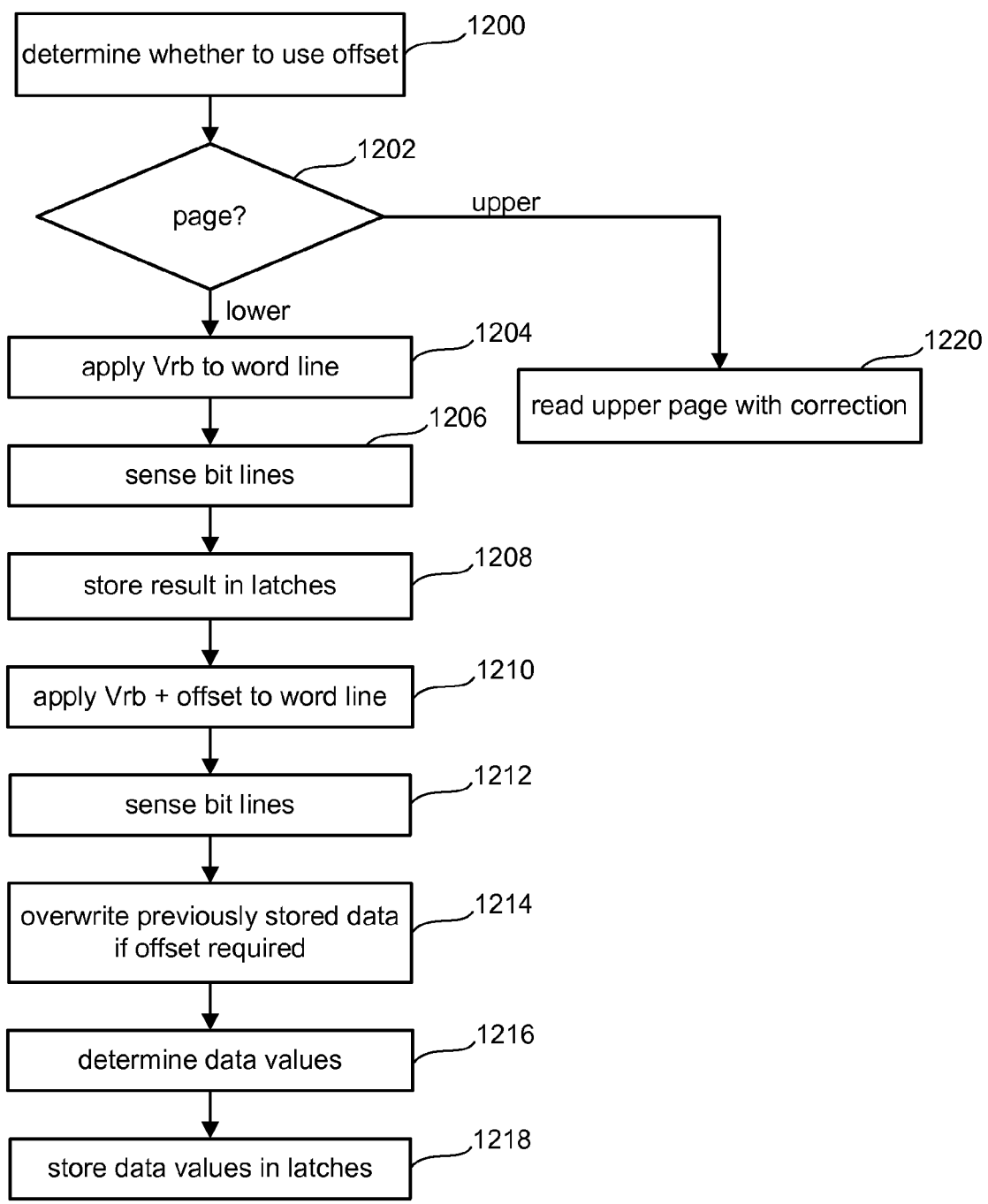
FIG. 30 is a flow chart describing one embodiment of a process for reading data while compensating for floating gate to floating gate (or dielectric region to dielectric region) coupling.

FIG. 30 depicts a flow chart describing one embodiment of a process for reading data while compensating for floating gate to floating gate coupling effect (see step 1066 of FIG. 27). In step 1200 of FIG. 30, the system determines whether to use an offset to compensate for the floating gate to floating gate coupling. This is performed separately for each bit line. The appropriate processor 392 will determine which bit lines need to use the offset based on the data from the neighboring word lines. If a neighboring word line is in state E or B (or has charge apparently indicating state E or B), then the particular word line being read need not compensate for the floating gate to floating gate coupling effect. The assumption is that if it is in state E it hasn't contributed to any coupling because the threshold hasn't moved since the current word line was written. If it is in state B, it got there from B', and the movement from B' to B is small and can be neglected. In one embodiment, the process of step 1200 can be performed concurrently with step 1060. For example, FIG. 31 provides a chart explaining steps to perform a determination whether to use an offset for a particular bit line. The first step is to perform a read process using Vra. The second step is to perform a read using Vrb. When reading at Vra, a latch stores a 1 if the memory cell is in state E and a 0 if the memory cell is in states A, B, C or. When reading at Vrb, the latch will store a 1 for states E and A, and store a 0 for states B and C. The third step of FIG. 31 includes performing an XOR operation on the inverted results from the second step with the results from step 1. In the fourth step, a read is performed using Vrc at the word line. A latch stores a 1 for states E, A and B, and stores a 0 for state C. In the fifth step, the results of step 4 and step 3 are operated by a logical AND operation. Note that steps 1, 2 and 4 may be performed as part of FIG. 28. Steps 3 and 5 of FIG. 31 can be performed by dedicated hardware or by processor 392. The results of step 5 are stored in a latch with 1 being stored if no offset is needed and 0 being stored if an offset is needed. The offset is used to compensate for the floating gate to floating gate coupling. Thus, a read offset will be required for those cells that are read on WLn that have neighboring memory cells on WLn+1 that are in the A or C state. This approach requires only one latch to determine whether to correct WLn or not, in contrast to the previous methods that store the full data from WLn+1, requiring two or more latches.

Looking back at step 1202 of FIG. 30, it is determined whether the page being read is the upper page or lower page. If the page being read is the lower page, then Vrb is applied to the word line associated with the page being read (step 1204). Note that for the binary state coding described in FIG. 19, reading at Vrb is sufficient to determine the lower page data, in contrast to the binary state coding described in FIGS. 17 & 18 in which reading at Vrb is used to determine the upper page data. In step 1206, the bit lines are sensed. In step 1208, the results of step 1206 are stored in the appropriate latches associated with the bit lines. In step 1210, Vrb plus an offset is applied to the word line being read. In step 1212, the bit lines are sensed. In step 1214, the results of the sensing of step 1212 are used to overwrite the results stored in step 1208 for the bit line for which it was determined at step 1200 to use an offset. If the particular bit line is determined not to have to use an offset, then the data from step 1212 is not stored. In step 1216, processor 392 will determine whether the data is 1 or 0 for the lower page. If the memory cell turned on in response to Vrb (or Vrb plus the offset, if appropriate), then the lower page data is 1; otherwise, the lower page data is 0. At step 1218, the lower page data is stored in the appropriate latches for communication to the user.

Figure 32:
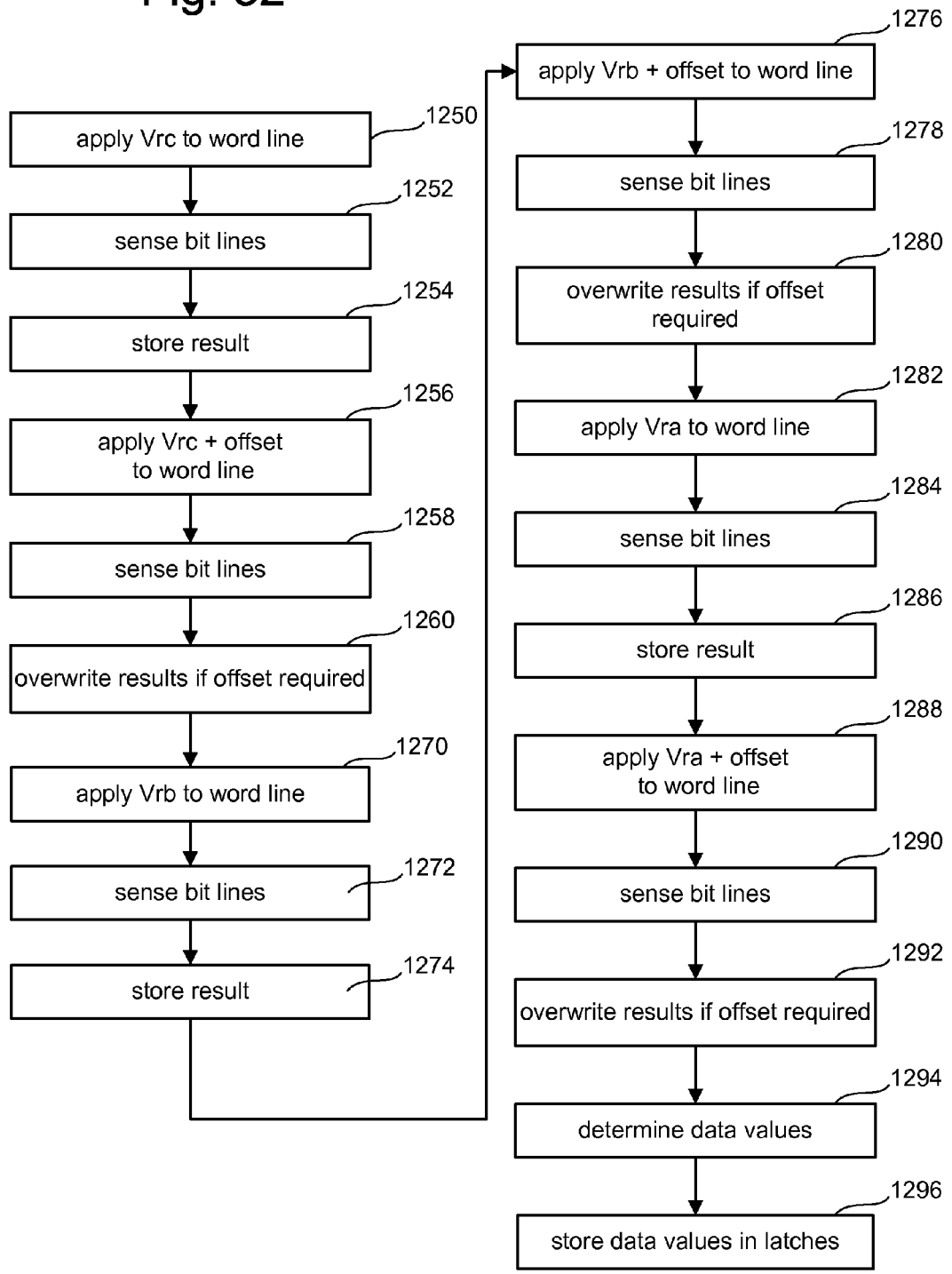
FIG. 32 is a flow chart describing one embodiment of a process for reading upper page data using a correction.

If it is determined at step 1202 that the page being read is the upper page, then the upper page correction process is performed at step 1220. FIG. 32 provides a flow chart describing the upper page correction process. In step 1250 of FIG. 32, read reference voltage Vrc is applied to the word line associated with the page being read. In step 1252, the bit lines are sensed. In step 1254, the results of the sensing step are stored in the appropriate latches. In step 1256, Vrc plus an offset (e.g., 0.1V) is applied to the word line associated with the page being read. In step 1258, the bit lines are sensed. In step 1260, the results of the sensing step 1258 are used to overwrite the results stored in step 1254 for any bit line for which the offset is required (see step 1200). At step 1270, Vrb is applied to the word line. In step 1272, the bit lines are sensed. In step 1274, the results of sensing step 1272 are stored. In step 1276, Vrb plus the offset is applied to the word line associated with the page being read. In step 1278, the bit lines are sensed. In step 1280, the results of step 1278 are used to overwrite the results stored at step 1274 for those bit lines for which the offset is required (see step 1200). In step 1282, Vra is applied to the word line associated with the page being read. In step 1284, the bit lines are sensed. In step 1286, the results of the sensing step 1284 are stored in the appropriate latches. In step 1288, Vra plus the offset is applied to the word line associated with the page being read. Note that the offset used in steps 1288, 1280 and 1256 are the same, implicitly assuming that the coupling to WLn from programming the upper page of WLn+1 in moving from state E to state A is approximately the same as when moving from state B' to C. In other embodiments, the offsets can differ. In step 1290, the bit lines are sensed. In step 1292, the results of step 1290 are used to overwrite the results stored in step 1286 for those bit lines for which the offset is required (see step 1200). In some embodiments, the margin between state E and state A is sufficient that the offset associated with Vra is not necessary and steps 1288 through 1292 may be skipped. In step 1294, the processor 392 determines the data values in the same manner as previously described with respect to FIG. 28 or another method known in the art. In step 1296, the data values determined by the processor 392 are stored in the appropriate data latches for communication to the user. In other embodiments the order of reading (Vrc Vrb, Vra) may be changed.

In the above discussion with respect to FIG. 27, an example is discussed involving the reading of a page of data. It is likely, but not required, that a request to read data will require the reading of multiple pages of data. In one embodiment, to speed up the process of reading multiple pages of data, the read process will be pipelined such that the state machine will execute a next page sensing while the user is transferring out the previous page of data. In such an implementation, the flag fetch process (see e.g., step 1006 of FIG. 28) may interrupt the pipelined read process. To avoid such an interruption, one embodiment contemplates reading the flag for a given page when that page is read and using the wired-OR detection process mentioned above to check the flag (rather than reading the flag and sending it to the state machine). For example, during step 1060 of FIG. 27 (reading the neighboring word line), the process first reads data using Vrc as the reference voltage. At that point, if the wired-OR line indicates that each state stores data 1, then the upper page has not been programmed; therefore, no compensation is needed and the system will read without compensating for the floating gate to floating gate coupling (step 1064). If the flag is a one-byte code that includes data in each data state, at least the flag memory cells would have data in state C if the flag is set. If the wired-OR line indicates that no memory cells have data in state C, then the state machine concludes that the flag has not been set; therefore, the upper page for the neighboring word line has not been programmed and compensation for floating gate coupling is not needed.

Figure 32A:
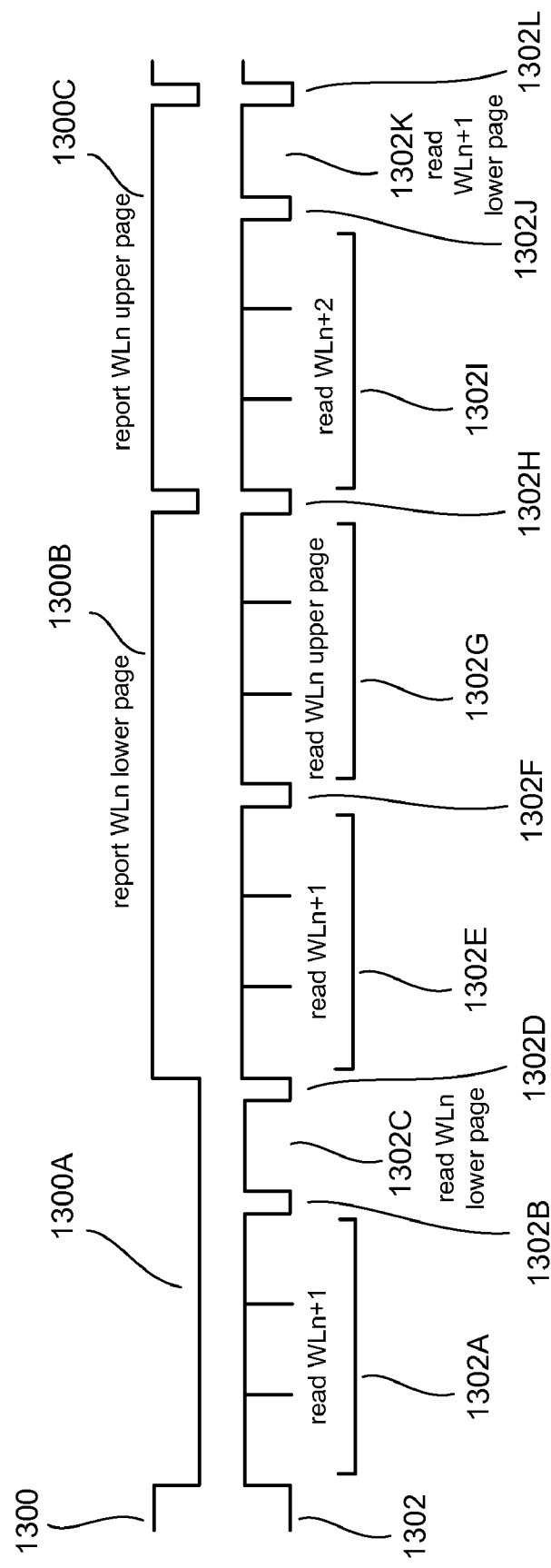
FIG. 32A is a timing diagram that describes a pipelined read process.

FIG. 32A is a timing diagram that explains one embodiment for performing pipelined reads as discussed above. FIG. 32A depicts two signals. Signal 1300 represents a Ready/Busy signal communicated from the memory system to the controller (or host/user) that when low indicates that the memory system is not yet ready to send data on I/O lines 320 and when high indicates that data is available to be transferred. FIG. 32A shows a pipelined read process in response to a read request that pertains to lower and upper pages for memory cells along word lines WLn, WLn+1, WLn+2, ... Signal 1300 first includes period 1300A, which corresponds to waiting for the first set of data to be ready for communication to the user. During period 1300B, data stored in the lower page of memory cells connected to word line WLn is transferred out to the user via I/O lines 320. During period 1300C, data stored in the upper page of memory cells connected to word line WLn is transferred out to the user via I/O lines 320. During the next period, data stored in the lower page of memory cells connected to word line WLn+1 is transferred out, and so on.

Signal 1302 of FIG. 32A is a symbolic representation of what is happening within the memory system. The first data to be read is the lower page of memory cells connected to word line WLn. During period 1302A, the neighboring word line WLn+1 is read (e.g., three read operations—at Vra, Vrb and Vrc). In period 1302B, the flag is fetched and communicated to the state machine to determine if the upper page was programmed. Note that because the pipeline has not started, the state machine can perform the read fetch. Alternately the wired-OR process after reading at Vrc (that was discussed above) can be employed to check the flag. In step 1302C, the lower page of WLn is read, using compensation as necessary as determined by the flag status. During period 1302D WLn lower page data is placed in the output registers.

In period 1302E, the neighboring word line WLn+1 is read (e.g., three read operations—at Vra, Vrb and Vrc). This step may not be needed since it was already done before. However, since the time associated with 1302E, 1302F, and 1302G is typically less than that associated with step 1300B, it may be performed for consistency of operation. Furthermore, in some embodiments there may not be enough latches available to simultaneously save the data associated with both WLn and WLn+1. During period 1302F, the flag for the WLn+1 is read by performing the wired-OR process after reading at Vrc, thereby avoiding the full flag fetch that stops the pipeline. During period 1302G, the upper page of WLn is read, using compensation as necessary. During period 1302H, signal 1302 drops while the WLn upper page data is transferred from the internal latches to the output registers.

After reading the lower and upper pages for WLn, the system will then read the lower and upper pages for WLn+1, and so on until all of the read data is provided to the user. In period 13021, the new neighboring word line WLn+2 is read (e.g., three read operations—at Vra, Vrb and Vrc). During period 1302J, the flag for the WLn+2 is read by performing the wired-OR process after reading at Vrc, thereby avoiding the full flag fetch that stops the pipeline. During period 1302K, the lower page of WLn+1 is read, using compensation as necessary. The process will continue, as discussed above. In some embodiments it may be useful to reduce the number of reads by reading WLn+1 data once followed by reading WLn upper and lower page data simultaneously and saving the upper page data rather than rereading it later. One advantage of reducing the number of read steps can be to minimize power consumption.

The above embodiments use multiple reads at different reference points. While this provides an accurate means for compensating for the floating gate to floating gate coupling, it adds extra time to the read process. Another embodiment is to modify the sense amplifier to add a correction feature. If the sense amplifier can be modified to sense a different trip point depending on the neighboring word line data, then a single sensing operation will give the final corrected data. This method can be reliable and save time. The drawback is the increase in sense amplifier layout area.

Figure 33:
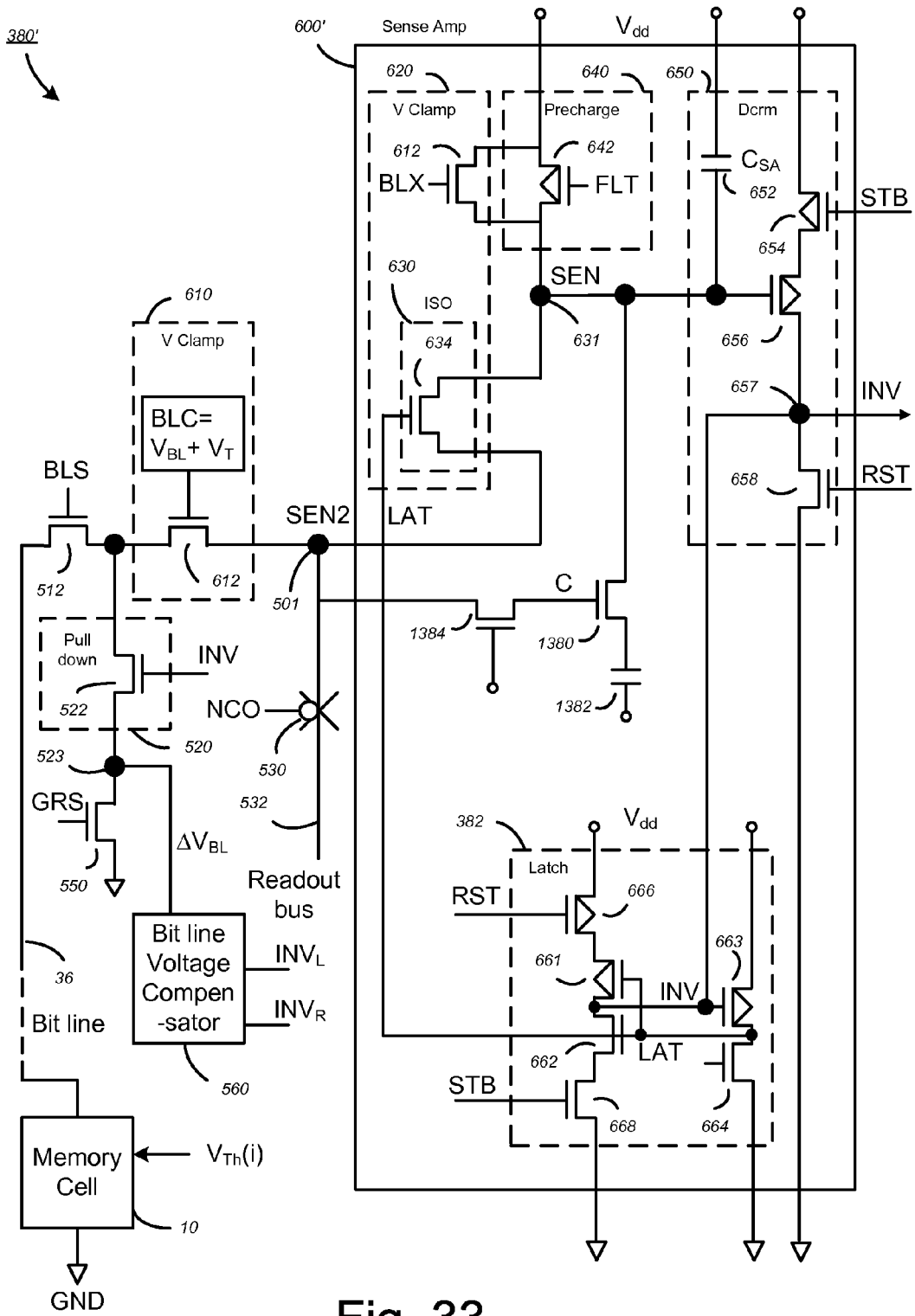
FIG. 33 is a schematic diagram of a sense module.

Looking back at FIG. 8, the sensing trip point is set based on capacitor CSA 652 of sense amplifier 600. Different trip points can be set for the same sensing process by using a different capacitor on the SEN mode depending on data from a neighboring word line. When no correction is needed, use a large capacitor. When correction is needed, use a smaller capacitor. FIG. 33 depicts a sense module 380' that is similar to the sense module 380 of FIG. 8. However, sense amplifier 600' includes an additional capacitor 1382 that is connected or not connected based on data from the neighboring word line. Capacitor 1382 is connected to the SEN mode via transistor 1380. Transistor 1380 is connected to the readout bus 532 via transistor 1384 and gate 530. Data from the neighboring word line is provided via readout bus 532 and transistor 1384 to the node C for transistor 1380. If data 1 is provided at node C, then no correction is needed due to the floating gate to floating gate coupling from a neighbor memory cell. If data 0 is provided at node C, then correction is needed. If no correction is needed, capacitor 1382 is electrically connected to SEN node. If correction is needed, capacitor 1382 is disconnected from SEN node. When the extra capacitor is not attached to SEN node, a smaller cell current associated with the higher (disturbed) threshold will charge the voltage on the capacitor equivalently to the lower threshold (undisturbed) state charging a higher capacitance.

Although FIG. 33 depicts selectively adding an additional capacitor, other embodiments can selectively add more capacitors to achieve different compensation effects. Additionally, some embodiments may have all of the capacitors connected to the SEN node selectively coupled so that each possibility (e.g., no compensation, compensation 1, compensation 2, . . . ) connects a different set of capacitors. In some implementations, other capacitive devices can also be used.

Figure 34:
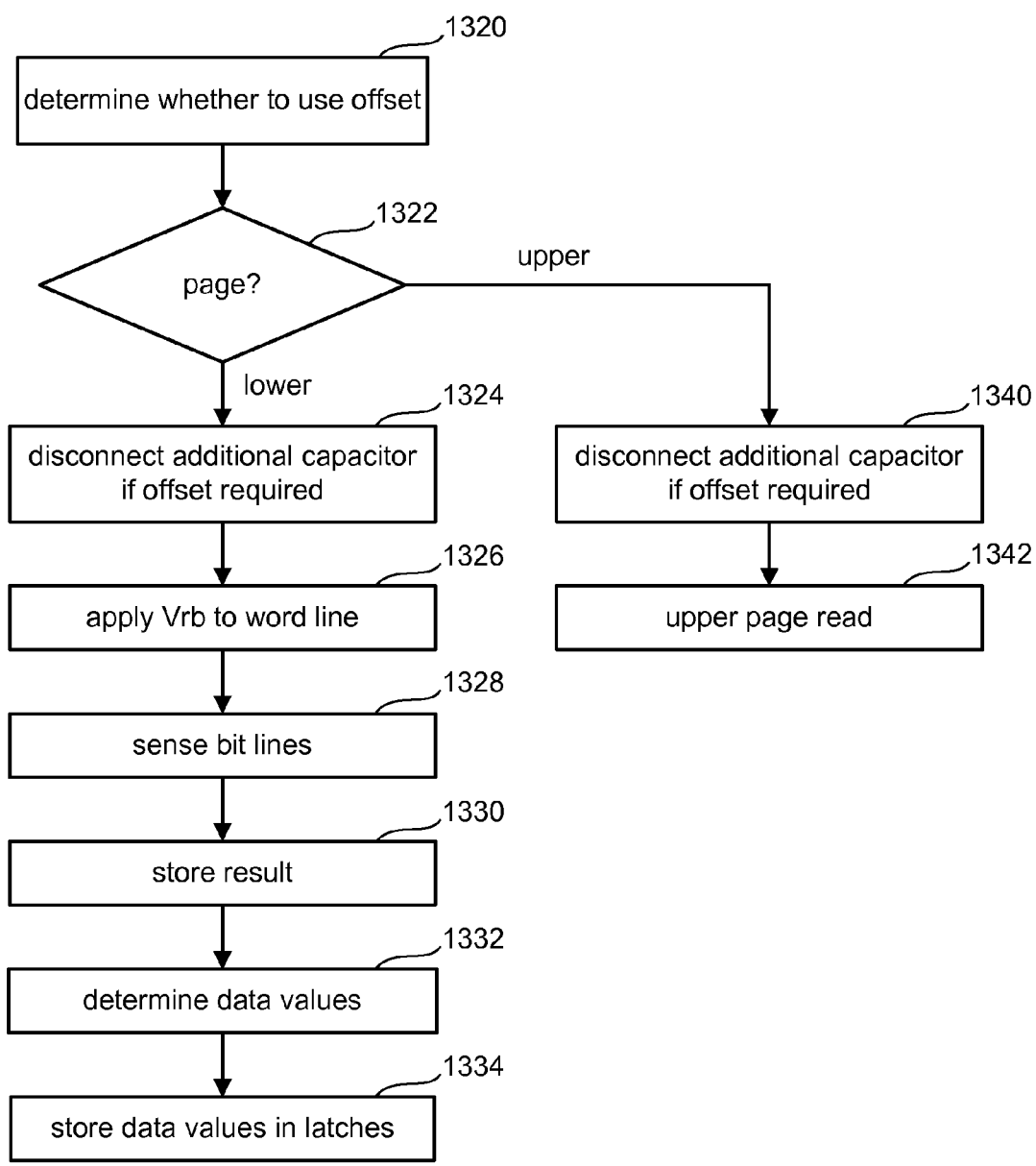
FIG. 34 is a flow chart describing one embodiment of a process for reading data.

FIG. 34 provides a flow chart describing one embodiment for using the two capacitors of FIG. 33. The method of FIG. 34 provides an alternative embodiment to the method of FIG. 30. In step 1320 of FIG. 34, a determination is made on a bit line basis whether to use the offset for that particular bit line. This is similar to step 1200 of FIG. 30. In step 1322, it is determined whether the read process is for the lower page or the upper page. If the read process is for the lower page, the method continues at step 1324. If the offset is required, then the additional capacitor is disconnected from the SEN 2 node. If the offset is not required, then the additional capacitor remains connected to the SEN 2 node. In step 1326, Vrb is applied to the word line associated with the page being read. In step 1328, the bit lines are sensed. In step 1330, the results of the sensing step 1328 are stored. In step 1332, processor 392 determines the data value stored. In one embodiment, when reading the lower page, if the memory cell turns on in response to Vrb being applied to the word line, then the lower page data is "1"; otherwise, the lower page data is "0." In step 1334, the data values determined by the processor are stored in the appropriate latches, for read out by the user.

If it is determined that the read process is for the upper page (step 1322), then the process continues to step 1340. If step 1320 concluded that the offset is required, then the additional capacitor is disconnected (step 1340). If the offset is not required, then the additional capacitor remains connected to the SEN 2 node. In step 1342, an upper page read process is performed, as described above with respect to FIG. 28.

As described above, when a large number of memory cells are sensed in parallel, their combined currents can result in significant voltage drop and a ground loop with finite resistance. This results in a source line bias. One embodiment utilizes this source line bias to compensate for the floating gate to floating gate coupling effect. One embodiment described above that takes into account the source line bias includes multiple sensing steps (also called strobes). During the first strobe, all appropriate bit lines will be connected to the source line. During the second strobe, a smaller subset of bit lines will be connected to the source line. The first strobe is performed with a higher source line offset voltage, which will indicate that the conducting cells are actually less conducting than they would be with no source line voltage offset. This is equivalent to a threshold voltage shift to a higher value. The process proposed is that the first strobe unconditionally saves data in the data latch. At the second strobe, check if some cells on the word line being read require compensation due to the floating gate coupling effect with the neighboring word line. If so, overwrite the data from the first strobe with the data from the second strobe for the cells that require correction. For cells that do not need correction, do not overwrite the data and discard the data from the second strobe. One advantage of using this method is that it reduces the read time as the data correction is hidden within the normal read routine.

A disadvantage of the source line bias method is that the value of the offset depends on the data pattern. If there are more conducting cells at a certain sensing level, the source voltage will be larger and more correction will be done. If there are less conducting cells at a certain sensing level, the source voltage will be less and fewer correction will be done. Assuming every page has perfectly random data, the shift would be a nearly constant value for every page. With two bits per memory cell, 25% of the bit lines may be in state E, 25% in state A, 25% in state B and 25% in state C. Reading at Vra, there will be 25% of the bit lines conducting. Reading at Vrc, there will be 75% of the bit lines conducting, resulting in more correction when reading state C than when reading state A.

Figure 35:
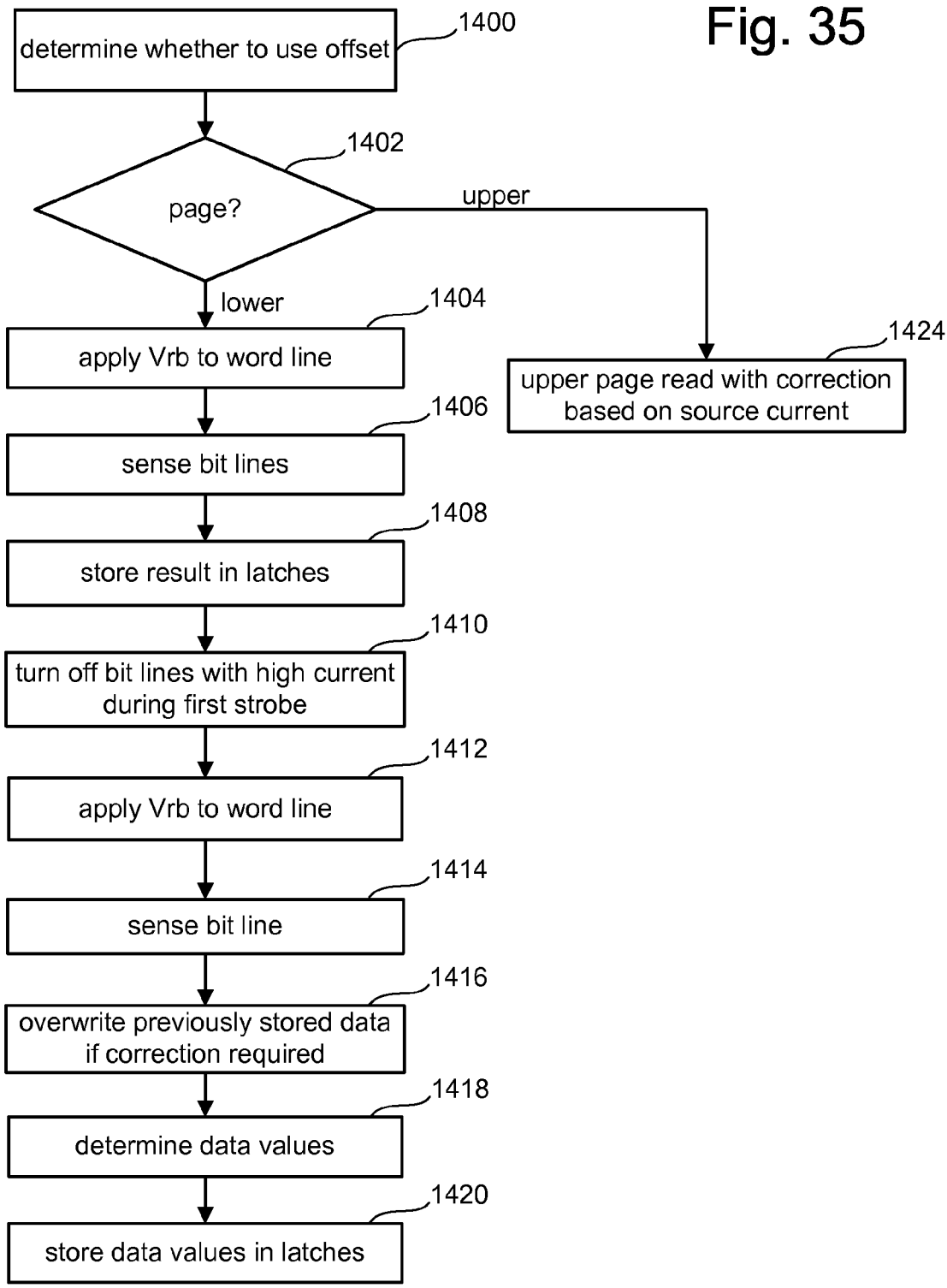
FIG. 35 is a flow chart describing one embodiment of a process for reading data.

FIG. 35 provides a flow chart describing one embodiment for reading with compensation (see step 1066), based on using the two strobe cycles discussed above. In step 1400, the system determines whether to choose the offset for the particular bit lines. This is similar to step 1200, described above. If the read process is for the lower page (step 1402), then the process continues at step 1404. If the read process is for the upper page, then the process continues at step 1424. In step 1404, the reference voltage Vrb is applied to the word line associated with the page being read. At step 1406, the bit lines are sensed. At step 1408, results of the sensing step 1406 are stored in the appropriate latches. Steps 1404-1408 are the first strobe. In step 1410, those bit lines determined to have a high current during the first strobe are turned off for the second strobe. In step 1412, the second strobe is started by applying Vrb to the word line. In step 1414, the bit lines are sensed. In step 1416, those bit lines for which the correction is required will have the data from step 1414 used to overwrite the data from step 1408. In step 1418, processor 392 determines the data values stored. In one embodiment, when reading the lower page, if the memory cell turns on in response to Vrb being applied to the word line, then the lower page data is "1"; otherwise, the lower page data is "0." In step 1420, the determined data values are stored in the appropriate latches, for communication to the user.

FIG. 36 provides a flow chart describing one embodiment of a process for performing upper page read with correction based on the source current (step 1424 of FIG. 35). In step 1502, reference voltage Vrc is applied to the word line associated with the page being read. In step 1504, the bit lines are sensed. In step 1506, the results are stored in the appropriate latches. In step 1508, those bit lines with high current are turned off for the second strobe. The first strobe includes steps 1502-1506. In step 1510, the second strobe is started by applying Vrc to the same word line. In step 1512, the bit lines are sensed. In step 1514, the results stored in step 1506 are overwritten by the results of step 1512 for those bit lines for which correction is required. In step 1516, the system checks the flag for the upper page programming, as described above. If the flag is set indicating that there is data programmed in the upper page, the process continues to step 1522. If the flag was not set, then at step 1520 the process of FIG. 36 is terminated, concluding that the upper page has not been programmed. Other processes or timing for checking the flag discussed above can also be used.

In step 1522, the first strobe is performed by applying Vrb to the word line associated with the page being read. In step 1524, the bit lines are sensed. In step 1526, the results are stored in the appropriate latches. In step 1528, those bit lines with high current in the first strobe are turned off for the second strobe. In step 1540, the second strobe is commenced by applying Vrb to the word lines. In step 1542, the bit lines are sensed. In step 1544, the results from step 1526 are overwritten by the results from step 1542 for those bit lines for which the offset is required. In step 1546, the first strobe is performed by applying Vra to the word line associated with the page being read. In step 1548, the bit lines are sensed. In step 1550, the results are stored from step 1548. In step 1552, the bit lines with high current during the first strobe are turned off for the second strobe. In step 1554, the second strobe is commenced by applying Vra to the word line. In step 1556, the bit lines are sensed. In step 1558, the results stored in step 1550 are overwritten by the results from step 1556 for those bit lines for which offset is required. In some embodiments, the margin between state E and state A is sufficient that the offset associated with Vra is not necessary and steps 1552 through 1558 may be skipped. In step 1560, processor 392 determines the data values stored based on the results stored in the latches. This is performed as discussed above with respect to step 1132. The data values determined by processor 392 are stored in the appropriate latches in step 1562.

As a result of the ability to reverse the effects of the floating gate to floating gate coupling, the margins between threshold voltage distributions can be made smaller or the memory system can program faster.

In the above embodiments, there were three additional reads for the neighboring word lines to read data stored in the four states. In other embodiments, fewer than three reads can be performed, thereby reducing the number of different offsets used. This will result in reducing resolution of the offsets. Additionally, more than three reads can be used to have a finer adjustment of the offset. In some embodiments, portions of the processes described above can be performed off chip.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. A method for reading a set of non-volatile storage elements, comprising:

for each non-volatile storage element of at least a subset of said non-volatile storage elements, determining an offset from a predetermined set of offsets based on a charge level stored in an adjacent storage element; and performing a set of read processes for said set of non-volatile storage elements, each read process of said set uses a different one of said predetermined set of offsets and is performed on all of said set of non-volatile storage elements, there is at least one read process for each offset, each of at least said subset of said set of non-volatile storage element provides final data from an appropriate one of said read processes associated with said offset determined for the respective non-volatile storage element.

2. A method according to claim 1, wherein:

said set of non-volatile storage elements store a first page of data; and said set of non-volatile storage elements are connected to a first word line.

3. A method according to claim 1, wherein:

said determining an offset from a predetermined set of offsets includes reading a state of said adjacent storage element and correlating said state with said set of offsets.

4. A method according to claim 1, wherein said set of read processes comprises:

performing a first read process using a first offset and storing results for one or more non-volatile storage elements having an adjacent non-volatile storage element in a first state;

performing a second read process using a second offset and storing results for one or more non-volatile storage elements having an adjacent non-volatile storage element in a second state; and performing a third read process with using a second offset and storing results for one or more non-volatile storage elements having an adjacent non-volatile storage element in a third state.

* * * * *